(12) United States Patent
Oh et al.

(10) Patent No.: US 11,126,497 B2
(45) Date of Patent: Sep. 21, 2021

(54) METHOD OF EQUALIZING BIT ERROR RATES OF MEMORY DEVICE

(71) Applicant: Samsung Electronics Co., Ltd., Suwon-si (KR)

(72) Inventors: Eun-chu Oh, Hwaseong-si (KR); Moo-sung Kim, Yongin-si (KR); Young-sik Kim, Suwon-si (KR); Yong-jun Lee, Hwaseong-si (KR); Jeong-ho Lee, Gwacheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/358,884

(22) Filed: Mar. 20, 2019

(65) Prior Publication Data

US 2019/0377632 A1 Dec. 12, 2019

(30) Foreign Application Priority Data

Jun. 7, 2018 (KR) ........................ 10-2018-0065658

(51) Int. Cl.
*G06F 11/10* (2006.01)
*G11C 29/52* (2006.01)
(Continued)

(52) U.S. Cl.
CPC ........ *G06F 11/1044* (2013.01); *G06F 11/076* (2013.01); *G06F 11/1068* (2013.01);
(Continued)

(58) Field of Classification Search
CPC ............ G11C 13/0004; G11C 13/0035; G11C 13/0069; G11C 29/52; G06F 11/1044; G06F 11/076; G06F 11/1068
(Continued)

(56) References Cited

U.S. PATENT DOCUMENTS 7,227,776 B2 6/2007 Cho et al.
8,397,127 B2 3/2013 Otsuka
(Continued)

FOREIGN PATENT DOCUMENTS

| JP | 07-152503 A | 6/1995 |
| JP | 2010-079485 A | 4/2010 |
| JP | 2016-038920 A | 3/2016 |

OTHER PUBLICATIONS

Extended European Search Report dated Oct. 25, 2019, for corresponding EP patent application 19174519.9.

*Primary Examiner* — Sung Il Cho
(74) *Attorney, Agent, or Firm* — Muir Patent Law, PLLC

(57) ABSTRACT

Provided is a bit error rate equalizing method of a memory device. The memory device selectively performs an error correction code (ECC) interleaving operation according to resistance distribution characteristics of memory cells, when writing a codeword including information data and a parity bit of the information data to a memory cell array. In the ECC interleaving operation according to one example, an ECC sector including information data is divided into a first ECC sub-sector and a second ECC sub-sector, the first ECC sub-sector is written to memory cells of a first memory area having a high bit error rate (BER), and the second ECC sub-sector is written to memory cells of a second memory area having a low BER.

18 Claims, 22 Drawing Sheets

(51) Int. Cl.
*G06F 11/07* (2006.01)
*G11C 13/00* (2006.01)

(52) U.S. Cl.
CPC ...... *G11C 13/0004* (2013.01); *G11C 13/0035* (2013.01); *G11C 13/0069* (2013.01); *G11C 29/52* (2013.01)

(58) Field of Classification Search
USPC .......................................................... 365/148
See application file for complete search history.

(56) References Cited

U.S. PATENT DOCUMENTS

| | | |
|---|---|---|
| 9,147,500 B2 | 9/2015 | Kim et al. |
| 9,792,990 B2 | 10/2017 | Kim et al. |
| 9,928,140 B2 | 3/2018 | Sunwoo |
| 10,067,825 B2 | 9/2018 | Im et al. |
| 2006/0004955 A1* | 1/2006 | Ware ................ G11C 11/40603 711/106 |
| 2009/0141567 A1 | 6/2009 | Lee et al. |
| 2011/0194333 A1* | 8/2011 | Kim .................... G11C 29/808 365/158 |
| 2012/0069657 A1 | 3/2012 | Choi et al. |
| 2012/0075916 A1 | 3/2012 | Mukai et al. |
| 2012/0246395 A1 | 9/2012 | Cho et al. |
| 2012/0300568 A1* | 11/2012 | Park ................ G11C 11/40622 365/222 |
| 2015/0364178 A1 | 12/2015 | Kim et al. |
| 2016/0055904 A1 | 2/2016 | Park et al. |
| 2016/0283319 A1 | 9/2016 | Chou |
| 2017/0075579 A1 | 3/2017 | Haga |
| 2018/0060194 A1 | 3/2018 | Ryu et al. |

\* cited by examiner

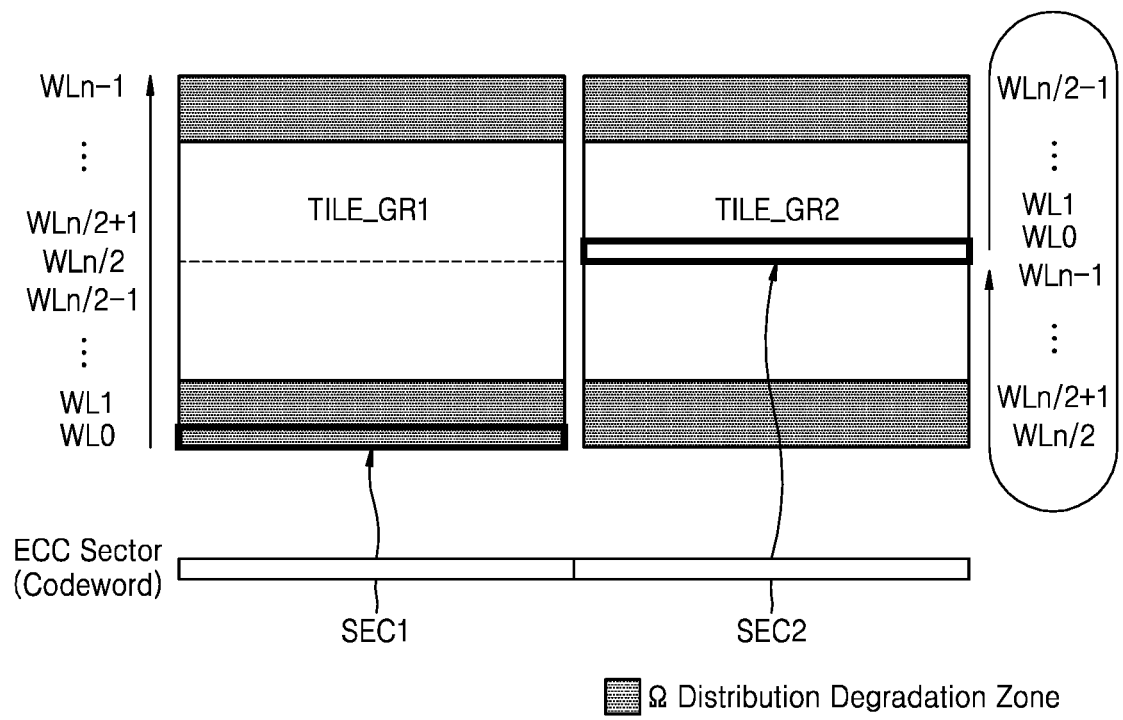

METHOD OF EQUALIZING BIT ERROR RATES OF MEMORY DEVICE

CROSS-REFERENCE TO RELATED APPLICATION

This application claims the benefit of Korean Patent Application No. 10-2018-0065658, filed on Jun. 7, 2018, in the Korean Intellectual Property Office, the disclosure of which is incorporated herein in its entirety by reference.

BACKGROUND

The inventive concept relates to non-volatile memory devices, and more particularly, to a memory device capable of reducing a burden on an error correction circuit via bit error rate (BER) equalization, a method of operating the same, and a memory system including the memory device.

Non-volatile memory devices may include resistive type memories such as phase-change RAM (PRAM), resistive RAM (RRAM), and magnetoresistive RAM (MRAM). Resistive type memories use, as a memory cell, a variable resistor for storing data based represented by the resistance state of the variable resistor. Materials used to form resistive type memories commonly have a resistance value that varies depending on a magnitude and/or a direction of a current or voltage and commonly have non-volatile characteristics so that a resistance value is maintained constant even when the current or voltage is cut off.

However, a resistance value of a variable resistor may vary depending on its location within an array of PRAM memory cells, and thus a bit error rate (BER) may vary in dependence on the physical location of the PRAM memory cells where data is stored. During a read operation, an error correction code (ECC) circuit may detect a bit error of data read from PRAM and may correct the detected bit error to obtain bit error free data. However, the number of error bits that can be corrected by the ECC circuit is limited. Thus, when the number of detected bit errors is within a correction capacity, the resistive type memory should perform a rewriting of the data with the bit error after the bit error is corrected by the ECC circuit (and thus store the data with no bit errors) to avoid a further bit error occurring in the data (which would be beyond the correction capability of the ECC circuit). On the other hand, when the number of detected error bits is beyond the correction capacity, the ECC circuit cannot correct the detected bit errors. Because data with a high number of bit errors should be rewritten in the memory after such bit error correction by the ECC circuit, a BER unbalance in a memory may create a big burden in maintaining data in the memory.

SUMMARY

The inventive concept provides a memory device capable of reducing a burden on an error correction circuit via bit error rate (BER) equalization, a method of operating the same, and a memory system including the memory device. In some examples, the memory device selectively performs an error correction code (ECC) interleaving operation according to resistance distribution characteristics of memory cells, when writing a codeword including information data and a parity bit of the information data to a memory cell array. In the ECC interleaving operation according to one example, an ECC sector including information data is divided into a first ECC sub-sector and a second ECC sub-sector, the first ECC sub-sector is written to memory cells of a first memory area having a high bit error rate (BER), and the second ECC sub-sector is written to memory cells of a second memory area having a low BER.

In some examples, a memory device comprises a memory cell array including a plurality of memory tiles, wherein each memory tile includes a plurality of word lines and a plurality of bit lines; and a control circuit configured to control a codeword including information data and a parity bit of the information data to be written to the memory cell array. The control circuit is further configured to divide an error correction code (ECC) sector including the information data into at least two ECC sub-sectors, and control one of the at least two ECC sub-sectors to be written to a first memory area having a high bit error rate and another of the at least two ECC sub-sectors to be written to a second memory area having a low bit error rate, and a bit error rate of the information data written to the first memory area and the information data written to the second memory area are equalized.

In some examples, a memory system includes a plurality of memory chips; and a memory controller configured to generate a parity bit by encoding information data that is to be written to the plurality of memory chips, generate a codeword including the information data and the parity bit, and provide the generated codeword to the plurality of memory chips. The memory controller is further configured to divide an error correction code (ECC) sector including the information data into at least two ECC sub-sectors, and control one of the at least two ECC sub-sectors to be written to a first memory area having a high bit error rate and another of the at least two ECC sub-sectors to be written to a second memory area having a low bit error rate, and a bit error rate of the information data written to the first memory area and the information data written to the second memory area are equalized.

BRIEF DESCRIPTION OF THE DRAWINGS

Embodiments of the inventive concept will be more clearly understood from the following detailed description taken in conjunction with the accompanying drawings in which:

FIGS. 11A through 11C are views for explaining an error correction code (ECC) interleaving operation according to an embodiment of the inventive concept;

DETAILED DESCRIPTION OF THE EMBODIMENTS

Figure 1:
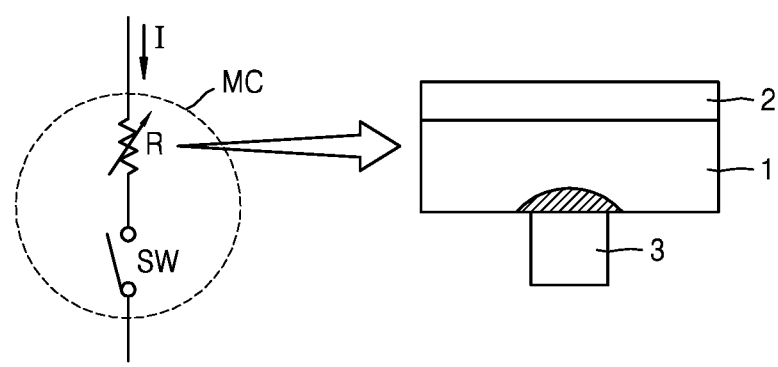
FIG. 1 is a schematic diagram of a memory cell included in a resistive type memory device, according to an exemplary embodiment of the inventive concept.

FIG. 1 is a schematic diagram of a memory cell MC included in a resistive type memory device, according to an exemplary embodiment of the inventive concept.

Referring to FIG. 1, the memory cell MC may include a variable resistor R and a switch SW. The switch SW may be implemented using various devices. For example, the switch SW may be a transistor or the switch SW may be a diode. As magnified portion of FIG. 1 (right side), the variable resistor R may include a phase-change layer 1, an upper electrode 2 provided on the phase-change layer 1, and a lower electrode 3 provided under the phase-change layer 1. In an embodiment, the phase-change layer 1 includes a germanium (Ge)-antimony (Sb)-tellurium (Te) (GST) material.

The GST material may be programmed between an amorphous state having relatively high resistivity (which may be referred to herein as simply "high resistivity") and a crystalline state having relatively low resistivity (which may be referred to herein as simply "low resistivity"). The GST material may be programmed by heating the GST material. A heating level and time may determine whether the GST material remains in an amorphous state or in a crystalline state after the GST material cools. The high resistivity and the low resistivity may represent programmed values of logic "0" and logic "1", respectively, of the memory cell MC and may be sensed by measuring resistivity of the GST material. Alternatively, the high resistivity and the low resistivity may represent programmed values logic "1" and logic "0", respectively, of the memory cell MC.

A pulse current I may be applied to the memory cell MC through the lower electrode 3. When the pulse current I flows through the memory cell MC for a very short time, the applied pulse current I may create heat above a certain threshold only at portions of the phase-change layer adjacent to the lower electrode 3. In this case, a part of the phase-change layer 1 (e.g., a hatched part in FIG. 1) may be changed to a crystalline state (or a set state) or an amorphous state (or a reset state). Whether a crystalline state or amorphous state is obtained may be due to a difference in heating profile.

Figure 2:
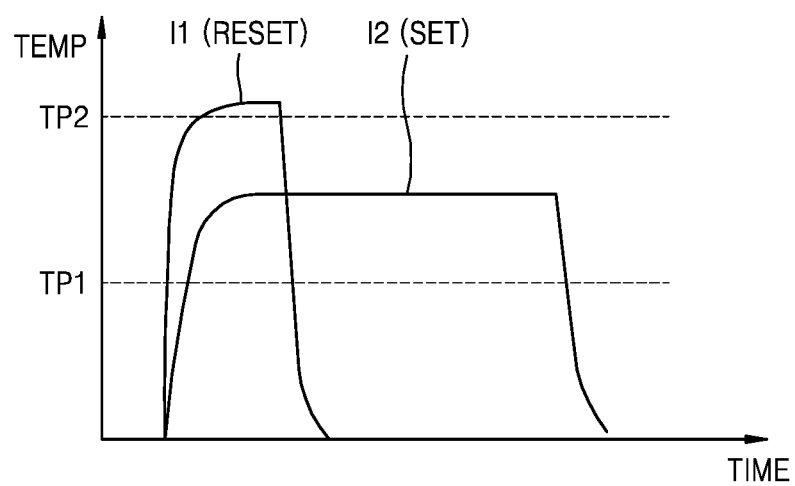
FIG. 2 is a graph for describing a write pulse applied to the memory cell of FIG. 1.

FIG. 2 is a graph showing exemplary heating profiles obtained when different write pulses are applied to the memory cell MC of FIG. 1. To change the phase-change layer 1 to an amorphous state (or a reset state), a reset pulse I1 of a relatively high current is applied to the memory cell MC for a relatively short time and then is terminated. To change the phase-change layer 1 to a crystalline state (or a set state), a set pulse I2 of a relatively low current (compared to the reset pulse I1) is applied to the memory cell MC, and the applied set pulse I2 is maintained for a certain time (longer than the duration of result pulse I1) to crystallize the phase-change layer 1 and then is terminated. The memory cell MC may be set to one of the crystalline and amorphous states as described above. In FIG. 2, TP1 indicates a crystallization temperature of the phase-change layer 1, and TP2 indicates a melting point of the phase-change layer 1.

Figure 3:
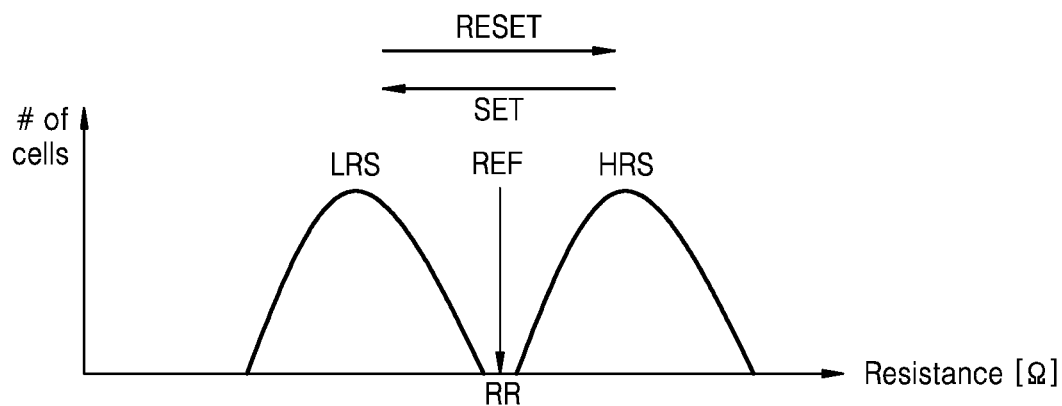
FIG. 3 is a graph for describing characteristics of the memory cell of FIG. 1.

FIG. 3 is a graph for describing characteristics of the memory cell MC of FIG. 1 showing an ideal distribution of single-level cells which are programmed with one bit of data. In FIG. 3, the horizontal axis indicates resistance, and the vertical axis indicates the number of memory cells.

As noted, the variable resistor R of the memory cell MC may be programmed to have a low resistance state LRS or a high resistance state HRS. A programming operation of switching the variable resistor R from the high resistance state HRS to the low resistance state LRS by applying a write pulse to the memory cell MC (e.g., as described with respect to FIG. 2) may be referred to herein as a set operation or a set write operation. A program operation of switching the variable resistor R from the low resistance state LRS to the high resistance state HRS by applying a write pulse to the memory cell MC (e.g., as described with respect to FIG. 2) may be referred to as a reset operation or a reset write operation.

An arbitrary resistance between a distribution based on the low resistance state LRS and a distribution based on the high resistance state HRS may be set as a reference resistance RR. In a read operation from a particular memory cell MC, reset data (logic "0") corresponding to the high resistance state HRS may be determined when a result of reading is equal to or greater than the reference resistance RR, and set data (logic "1") corresponding to the low resistance state LRS may be determined when the result of reading is less than the reference resistance RR.

Figure 4:
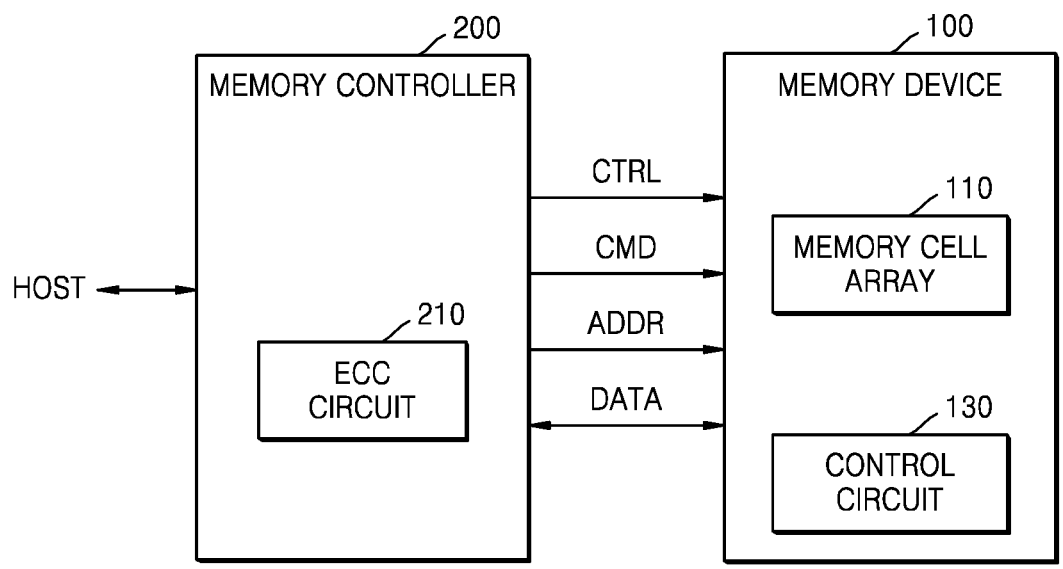
FIG. 4 is a block diagram of a memory system according to an embodiment of the inventive concept.

FIG. 4 is a block diagram of a memory system 10 according to an embodiment of the inventive concept. Referring to FIG. 4, the memory system 10 may include a memory device 100 and a memory controller 200. Each of the memory device 100 and memory controller 200 may be formed as a semiconductor chip (e.g., an integrated circuit formed as a semiconductor chip). In response to a write/read request from a host HOST, the memory controller 200 may control the memory device 100 such that data is read from the memory device 100 or written to the memory device 100. In detail, the memory controller 200 may control program (or write) and read operations with respect to the memory device 100, by providing an address ADDR, a command CMD, and a control signal CTRL to the memory device 100 via corresponding signal lines (e.g., forming a bus) connecting the memory device 100 and the memory controller 200. Data to be written and read data (shown as "DATA" in FIG. 4) may be transmitted between the memory controller 200 and the memory device 100.

The memory device 100 may include a memory cell array 110 and a control circuit 130. The memory cell array 110 may be formed of a plurality of memory cells MC (such as those described with respect FIG. 1), and the plurality of memory cells MC may be provided at intersections between a plurality of first signal lines and a plurality of second signal lines. According to an exemplary embodiment, the plurality of first signal lines may be a plurality of word lines, and the plurality of second signal lines may be a plurality of bit lines. According to another exemplary embodiment, the plurality of first signal lines may be a plurality of bit lines, and the plurality of second signal lines may be a plurality of word lines. The plurality of word lines may be connected to and activated by a row decoder (which may decode a row address to activate a corresponding word line). The plurality of bit lines may be connected to a data buffer (e.g., through I/O lines) to transmit data to and from the memory cells MC. The memory device 100 including the memory cell array 110 may constitute a cross-point memory device.

According to the example of present embodiment, the plurality of memory cells MC may be resistive type memory cells, each including a variable resistor R. For example, each variable resistor may be formed of a phase change material (e.g., Ge—Sb—Te (GST)) having resistance that varies according to temperature applied thereto, and the memory device 100 may be a phase change RAM (PRAM). As another example, each variable resistor may include an upper electrode, a lower electrode, and transition metal oxide (or complex metal oxide) between the upper and lower electrodes, and the memory device 100 may be a resistive RAM (RRAM). As another example, each variable resistor may include a magnetic upper electrode, a magnetic lower electrode, and a dielectric between the magnetic upper and lower electrodes, and the memory device 100 may be a magnetoresistive RAM (MRAM). Accordingly, the memory device 100 may be a resistive type memory device (whether PRAM, RRAM or MRAM), and the memory system 10 may be referred to as a resistive memory system.

According to an embodiment, each memory cell may be a single-level cell (SLC) for storing only one bit of data. In this embodiment, the memory cells may have two resistance distributions as illustrated in FIG. 3, according to the state of the stored data. According to another embodiment, each memory cell may be a multi-level cell (MLC) for storing two or more bits of data. In this embodiment, the memory cells may have four or more resistance distributions according to the state of the stored data. According to another embodiment, each MLC memory cell may be a triple-level cell (TLC) for storing data of three bits. In this embodiment, the memory cells may have eight resistance distributions according to the state of the stored data. However, the inventive concept is not limited thereto. For example, in another embodiment, the memory cell array 110 may include memory cells each capable of storing data of four or more bits. Alternatively, the memory cell array 110 may include a combination of SLCs and/or two bit MLCs and/or TLCs.

The control circuit 130 may control overall operations of the memory device 100. According to the present embodiment, the control circuit 130 may control levels of voltages applied to the first and second signal lines connected to the memory cell array 110 and timings at which the voltages are applied. The voltages may include operating voltages applied to selected first and second signal lines and inhibit voltages applied to non-selected first and second signal lines.

The memory controller 200 may include an error correction code (ECC) circuit 210. The ECC circuit 210 may perform ECC encoding on write data and ECC decoding on read data. In more detail, the ECC circuit 210 may perform ECC encoding on information data received from the host HOST during a write operation, thereby generating a codeword and providing the codeword to the memory device 100. The ECC circuit 210 may perform ECC decoding on the read data, i.e. the read codeword, received from the memory device 100 during a read operation, thereby generating information data and providing the information data to the host HOST. Although the ECC circuit 210 is provided with the memory controller 200, the ECC circuit 210 may instead be formed as part of the memory device 100. Thus, via its ECC circuit, the memory device 100 may perform ECC encoding on information data received from the memory controller 200 (which may be the same as that provided by the host HOST) to generate the codeword that is then written into the memory cell array 110, and may perform ECC decoding on codewords stored and read from the memory cell array 110 to obtain information data which is then sent to the memory controller 200. Alternatively providing the ECC circuit as part of the memory device 100 (which may have the same structure and operation as ECC circuit 210) applies to all embodiments described herein. However, it should also be appreciated that providing the ECC circuit as part of the memory device 100 would not exclude further ECC encoding/decoding by an ECC circuit in controller 200.

According to the present embodiment, the ECC circuit 210 may perform ECC encoding and ECC decoding by using a low density parity check (LDPC) code. According to another embodiment, the ECC circuit 210 may perform ECC encoding and ECC decoding by using an algorithm such as a Reed-Solomon (RS) code, a Hamming code, a cyclic redundancy code (CRC), etc. The ECC circuit 210 may perform ECC encoding on information data of a predetermined size to generate a check code (e.g., a LDPC code or other error correcting code) that together with the information data form a codeword (also referred to herein as an ECC sector).

A resistance distribution may be degraded according to locations of the memory cells MC of the memory cell array 110. Accordingly, the probability that an error of the data stored in the memory cells MC occurs may increase, and an error occurrence frequency may vary according to locations of the memory cells MC. This BER unbalance may be a significant burden in determining the correction capacity of the ECC circuit 210. To reduce the BER unbalance, the control circuit 130 may control an ECC interleaving operation to be performed when information data included in the codeword provided by the ECC circuit 210 is written to the memory cell array 110. The ECC interleaving operation may include a word line interleaving operation, a bit line interleaving operation, a convolution interleaving operation, and/ or a stack layer interleaving operation. An interleaving operation described herein may refer to an access operation of memory to different relative locations within corresponding portions of memory.

Figure 5A:
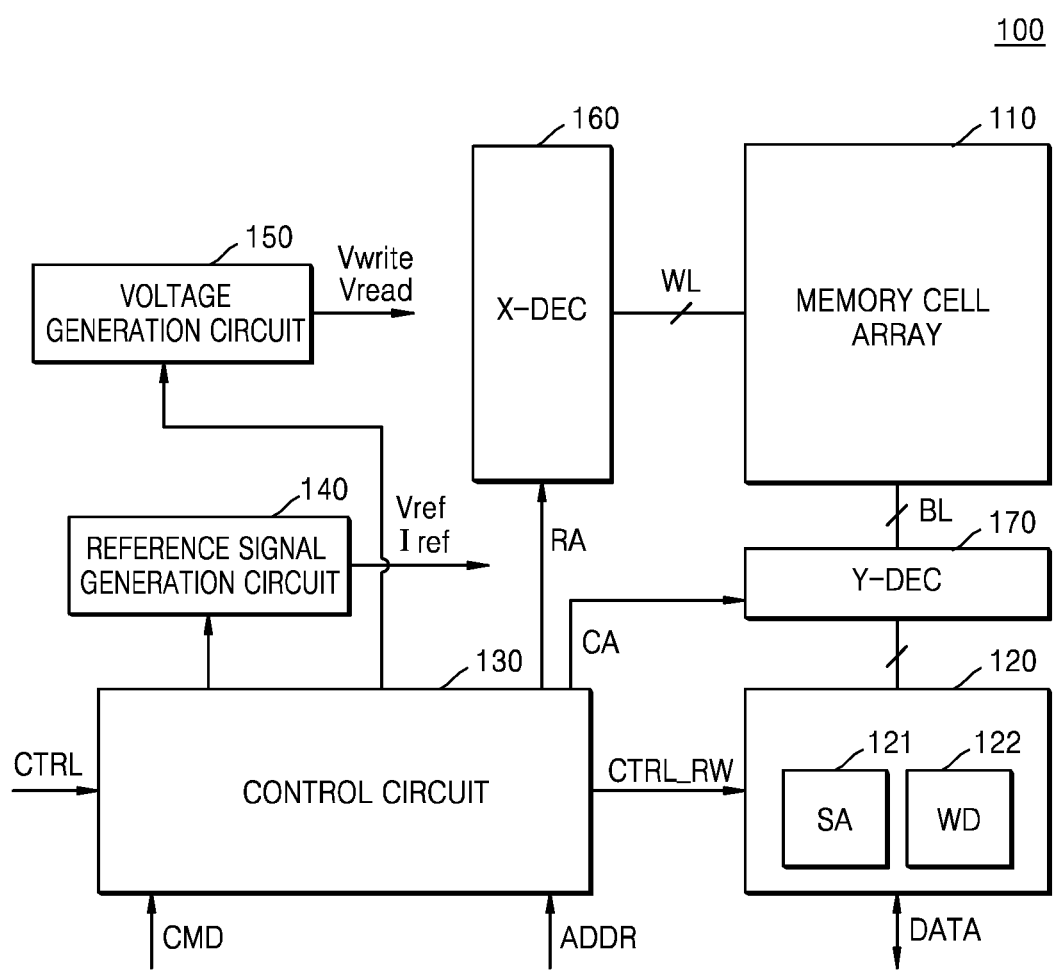
FIG. 5A is a block diagram illustrating, in greater detail, a memory device included in the memory system of FIG. 4.

FIG. 5A is a block diagram illustrating, in greater detail, the memory device 100 included in the memory system 10 of FIG. 4.

Referring to FIG. 5A, the memory device 100 may include a memory cell array 110, a write/read circuit 120, a control circuit 130, a reference signal generation circuit 140, a voltage generation circuit 150, a row decoder 160, and a column decoder 170. The write/read circuit 120 may include a sense amplifier array (SA) 121 including one or more sense amplifiers and a write driver circuit (WD) 122 including one or more write drivers.

Memory cells included in the memory cell array 110 may be connected to a plurality of first signal lines and a plurality of second signal lines. According to an exemplary embodiment, the plurality of first signal lines may be a plurality of word lines WL, and the plurality of second signal lines may be a plurality of bit lines BL. In response to various voltage signals or current signals provided through the bit lines BL and the word lines WL. Data may be written to or read from selected memory cells (e.g., those connected to a word line selected by the row decoder 160), and the data may be prevented from being written to or read from non-selected memory cells (e.g., those not connected to a word line selected by the row decoder 160).

The memory device 100 may receive an address ADDR for identifying a memory cell that is to be accessed, along with a command CMD. The address ADDR may include a row address RA identifying and selecting one of the word lines WL of the memory cell array 110 and a column address CA for identifying and selecting a subset of the bit lines BL of the memory cell array 110. The row decoder 160 may perform a word line selection operation (e.g., activation of the selected word line) in response to the row address RA. The column decoder 170 may perform a bit line selection operation in response to the column address CA (e.g., selecting a subset of the bit lines BL to access memory cells connected to the selected subset of bit lines BL and connected to the activated, selected word line). Such an access operation may be a read operation or a write operation (and it should be appreciated that reference to an access operation herein generically refers to such read and write operations, unless context indicates otherwise).

The write/read circuit 120 may be connected to the bit lines BL of the memory cell array 110 to write or read data to or from a memory cell. The voltage generation circuit 150 may generate write voltages Vwrite used in a write operation and a read voltage Vread used in a read operation. The write voltages Vwrite may include a set voltage and a reset voltage (e.g., such as those described herein) related to the write operation. The write voltages Vwrite and the read voltage Vread may be provided to selected ones the bit lines BL through and as selected by the column decoder 170.

The reference signal generation circuit 140 may generate a reference voltage Vref and/or a reference current Iref, one or both which may be used in a data read operation. For example, a sense amplifier of SA 121 may be connected to a node (for example, a sensing node) of a selected bit line BL to determine data of a memory cell MC to which the bit line BL is connected. A data value of the memory cell MC may be determined through an operation of comparing a voltage of the sensing node with the reference voltage Vref. Alternatively, when a current sensing method is implemented, the reference signal generation circuit 140 may generate and provide the reference current Iref to the memory cell array 110. The data value may be determined through an operation of comparing a voltage of the sensing node caused by the reference current Iref with the reference voltage Vref. Plural bit lines BL may be selected and have data read simultaneously from plural memory cells to which they are connected (e.g., by one of the sensing methods described herein) and plural sense amplifiers of SA 121 may each connect to a corresponding sensing node of a corresponding one of the such selected bit lines BL. For example, different column addresses my identify different subsets of the bit lines BL and be decoded by the column decoder 170 to select the same.

The write/read circuit 120 may provide a result of determining the read data to the control circuit 130. The control circuit 130 may control write and read operations of the memory cell array 110 by referring to the result of the determination.

The control circuit 130 may output various controls signals CTRL_RW for writing or reading the data to or from the memory cell array 110 based on the command CMD, the address ADDR, and the control signal CTRL that are received externally (in this example, from the memory controller 200). Accordingly, the control circuit 130 may control internal operations of the memory device 100.

The control circuit 130 may determine an ECC interleaving method such that, when the information data included in the codeword provided by the ECC circuit 210 of FIG. 4 is written to the memory cell array 110, a BER may be equalized. Once the ECC interleaving method is determined, the control circuit 130 may selectively perform ECC interleaving operations including a word line interleaving operation, a bit line interleaving operation, a convolution interleaving operation, and a stack layer interleaving operation, when the information data is written to the memory cell array 110.

When performing a selected ECC interleaving operation, the control circuit 130 may alter the addressing of the memory cell array 110. The control circuit 130 may control the row decoder 160 and the column decoder 170 such that addressing of a word line and/or a bit line of the memory cell array 110 is changed according to the ECC interleaving operation (which may be selected in some examples).

The control circuit 130 may perform a word line interleaving operation with respect to different memory tiles included in the memory cell array 110. When the control circuit 130 performs a word line interleaving operation on first and second memory tiles, the control circuit 130 may change word line addressing of one or both of first and second memory tile groups.

The control circuit 130 may perform a word line interleaving operation with respect to different banks included in the memory cell array 110. When the control circuit 130 performs a word line interleaving operation on first and second memory banks, the control circuit 130 may change word line addressing of one or both of the first and second memory banks.

The control circuit 130 may perform a bit line interleaving operation with respect to different memory tiles included in the memory cell array 110. When the control circuit 130 performs a bit line interleaving operation on the first and second memory tiles, the control circuit 130 may change bit line addressing of one or both of the first and second memory tile groups.

The control circuit 130 may perform a convolution interleaving operation with respect to different memory tiles included in the memory cell array 110. When the control circuit 130 performs a convolution interleaving operation on the first and second memory tiles, the control circuit 130 may change word line addressing and bit line addressing of one or both of the first and second memory tile groups.

The control circuit 130 may perform a stack layer interleaving operation with respect to stacked memory tiles included in the memory cell array 110. When the control circuit 130 performs a stack layer interleaving operation on the stacked memory tiles, the control circuit 130 may change word line addressing and bit line addressing of one or both of stacked memory tile groups.

Accordingly, as the control circuit 130 selectively performs an ECC interleaving operation, a BER unbalance according to locations of the memory cells included in the memory cell array 110 may be reduced.

Figure 5B:
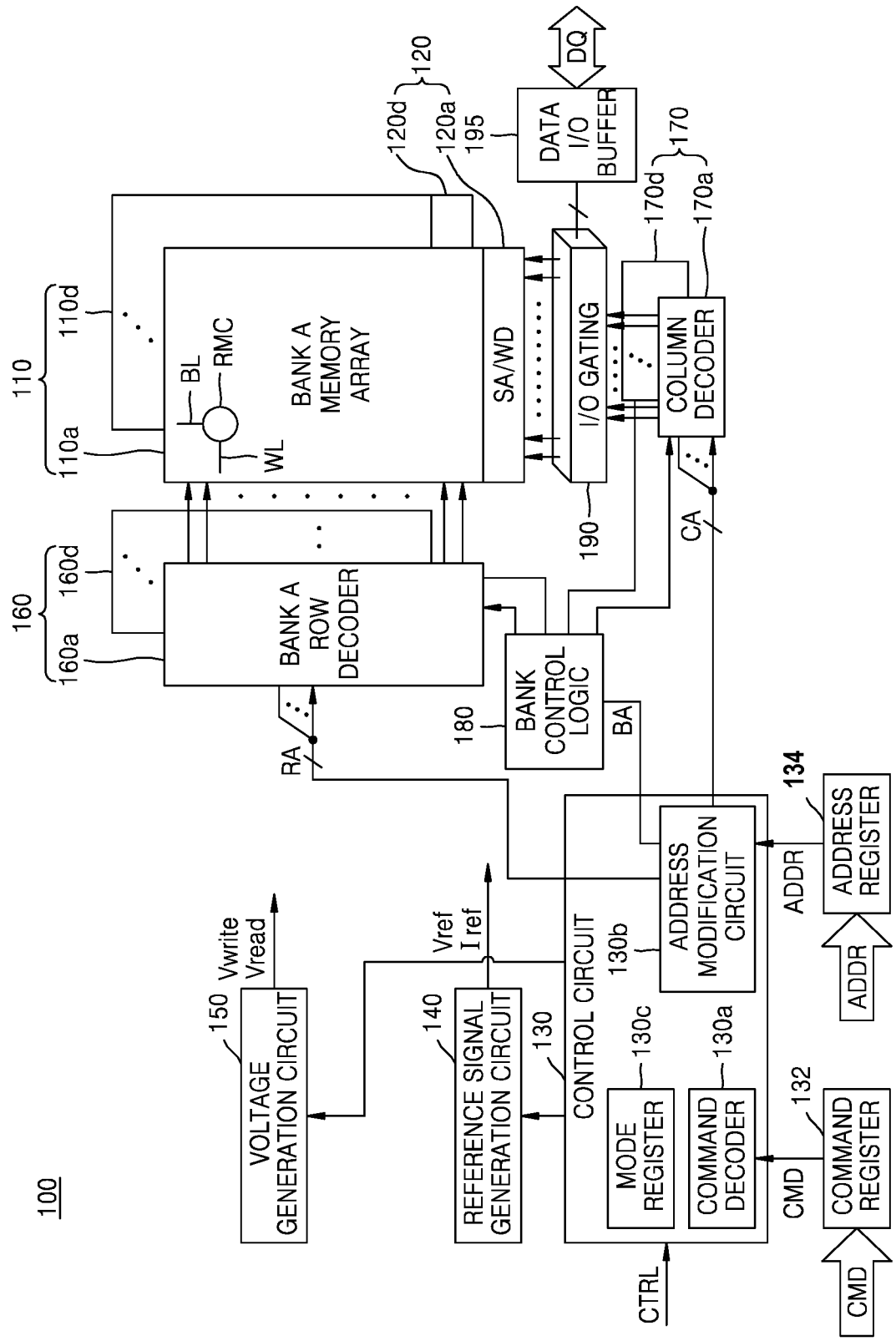
FIG. 5B is a block diagram illustrating exemplary details of the memory device of FIG. 5A

FIG. 5B illustrates an exemplary implementation of the memory device of FIG. 5A. The memory device of FIG. 5B is organized into a plurality of memory banks, including bank memory arrays 110a to 110d (forming memory array 110), bank row decoders 160a to 160d (forming row decoder 160), bank column decoders 170a to 170d (forming column decoder 170) and a plurality sense amplifier/write driver arrays (SA/WD) 120a to 120d forming write driving circuit 120. Each memory bank is independently and separately operable so that access operations of the memory banks may be performed independently from one another (such as in response to different externally received commands CMD such as from controller 200), and where such access operations may be performed at the same time. As shown in FIG. 5B, each memory bank is provided with its own (and independently operable) row decoder and column decoder. Bank control logic 180 may control operations of the memory array banks by providing timing and enabling signals (e.g., in response to a received and decoded bank address and other control signals from control circuit 130).

FIG. 5B also illustrates further exemplary details, including an I/O gating circuit 190 configured to connect bit lines BL selected by column decoder 170 to data I/O buffer (i.e., those bit lines BL identified by a column address CA decoded by column decoder 170). Further, memory device 100 may include a command register 132 and address register 134 to latch externally received commands CMD and addresses ADDR (e.g., provided by memory controller 200).

FIG. 5B also illustrates control circuit 130 includes command decoder 130a, an address modification circuit 130b and a mode register 130c. Command decoder 130a may receive the externally received command CMD from the command register 132, decode the same and provide corresponding internal commands (e.g., control signals) to implement the operation of the received command CMD. Address modification circuit 130b may receive the externally received address ADDR from address register 134 and modify one or more bits of the received address ADDR.

Although the address modification circuit 130b is shown as contiguous and located apart from the memory banks, the address modification circuit 130b may include distributed circuit portions, such as adjacent to the bank row decoders 160a to 160d and/or adjacent to the bank column decoders 170a to 170d. The address modification circuit 130b may invert one or more address bits of a subset of all addresses ADDR. For example, the address modification circuit 130b may invert one or more address bits for addresses ADDR identifying some of the memory banks but not invert address bits for addresses ADDR identifying the other the memory banks. For example, when an access operation is to be performed for banks 110b and 110d (which may correspond to odd bank addresses, e.g.,) address modification circuit 130b may (i) invert a selected one (e.g., predetermined one) of the address bits of the row address RA, (ii) invert a selected one (e.g., predetermined one) of the address bits of the column address CA or (iii) invert a selected one (e.g., predetermined one) of the address bits of the row address RA and the column address CA. When an access operation is to be performed for banks 110a and 110c, no modification may be performed by the address modification circuit 130b.

The address modification circuit 130b may be configurable. For example, a mode register 130c may comprise a register that is programmable via a mode register access command (e.g., programmable by memory controller 200) to set what address bit(s) should be inverted. Alternatively, the address modification circuit 130b may be programmable as part of a manufacturing process and include a fuse set that may be set (e.g., via a laser or other one time programming) to identify address bit(s) to be inverted. Alternatively, the address modification circuit 130b may be hardwired, such as being implemented by inverters interposed between addresses output by control circuit 130 and some of the bank row decoders 160a to 160d and/or some of the bank column decoders 170a to 170d.

Figure 6:
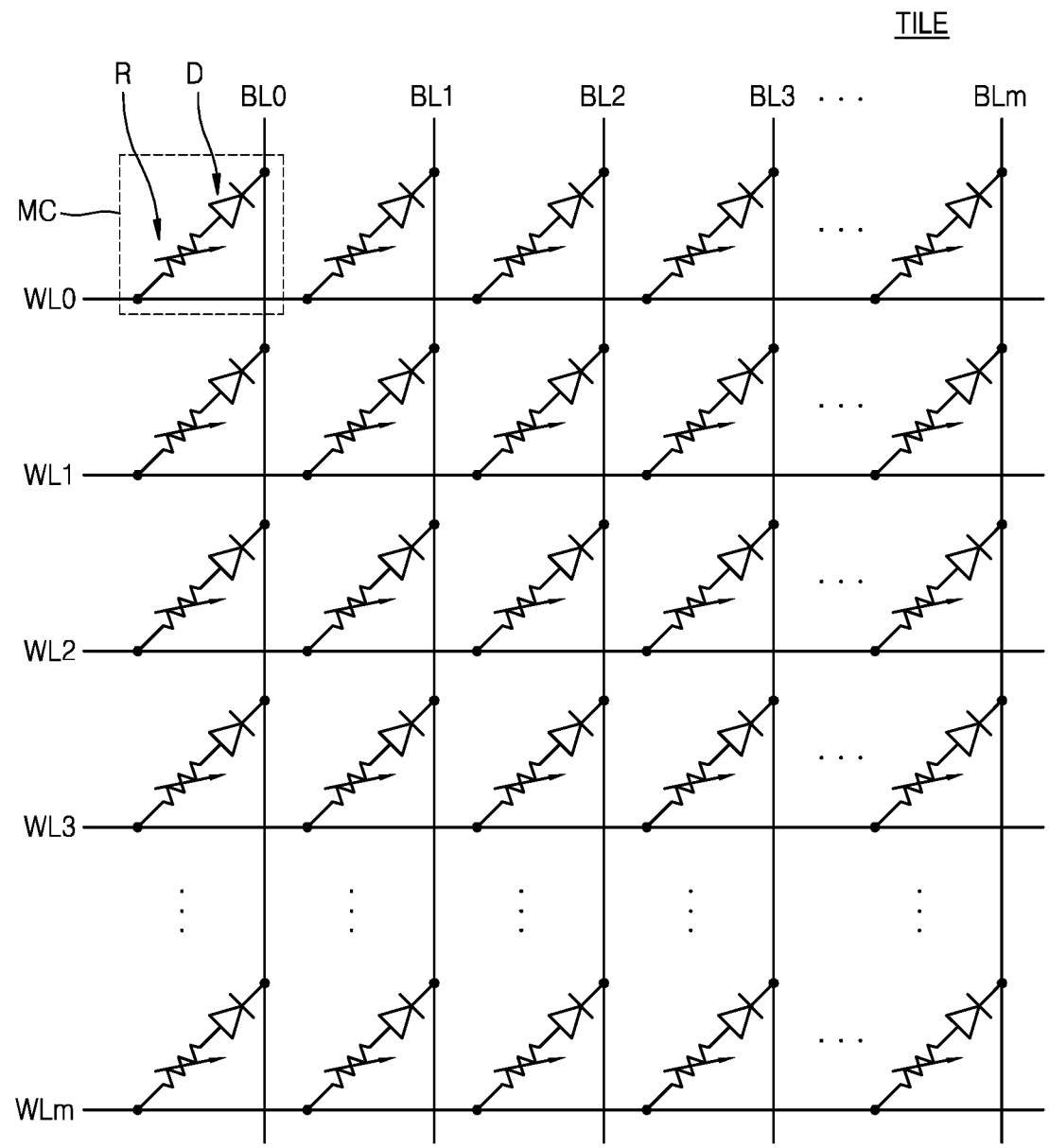
FIG. 6 is a circuit diagram illustrating exemplary details of a memory cell array included in the memory device of FIGS. 5A and/or 5B.

FIG. 6 is a circuit diagram illustrating further details of a portion of the memory cell array 110 of FIGS. 5A and 5B. The memory cell array 110 may include a plurality of memory tiles, and FIG. 6 illustrates an example of one memory tile TILE.

Referring to FIG. 6, the memory tile TILE may be formed by a plurality of word lines WL0 to WLm, a plurality of bit lines BL0 to BLm, and a plurality of memory cells MC. The number of word lines WL, the number of bit lines BL, and the number of memory cells MC may be selected based on various design criteria and be variously changed according to some embodiments.

According to the present embodiment, each of the plurality of memory cells MC may include a variable resistor R and a selector D. Herein, the variable resistor R may be a variable resistance material, and the selector D may be referred to as (and constitute) a switch.

Each memory cell MC may include a variable resistor R and a selector D connected in series between a corresponding one of the plurality of bit lines BL0 to BLm and a corresponding one of the plurality of word lines WL0 to WLm. In the example shown in FIG. 6, the series connection of each memory cell MC is WL-R-D-BL (word line-variable resistor-selector bit line), but the order of the series connection may also be implemented as WL-D-R-BL (e.g., the selector D may be connected between one of the plurality of bit lines BL0 to BLm and the variable resistor R, and the variable resistor R may be connected between the selector D and one of the plurality of word lines WL0 to WLm).

The selector D may be connected between one of the plurality of word lines WL0 to WLm and a variable resistor R to control the supply of current to the variable resistor R based on a voltage applied to the connected word and bit lines. In some examples, the selector D may be a PN or PIN junction diode. In this case, an anode of the diode may be connected to the variable resistor R and a cathode thereof may be connected to one of the plurality of bit lines BL0 to BLm. When a voltage difference between the anode and the cathode of the diode is greater than a threshold voltage of the diode, the diode may be turned on, and thus a current may be supplied to the variable resistor R.

Figure 7A:
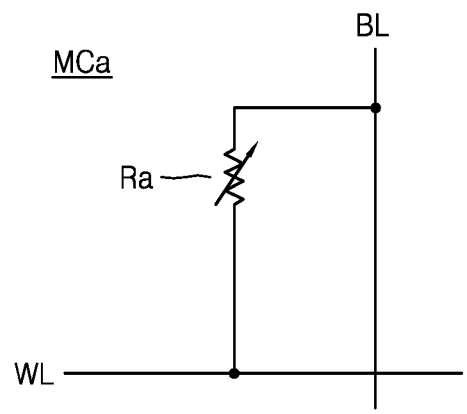
FIGS. 7A through 7C are circuit diagrams illustrating modified examples of a memory cell of FIG. 6.
Figure 7B:
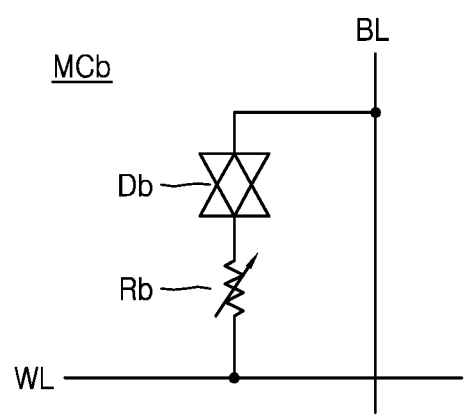
Figure 7C:
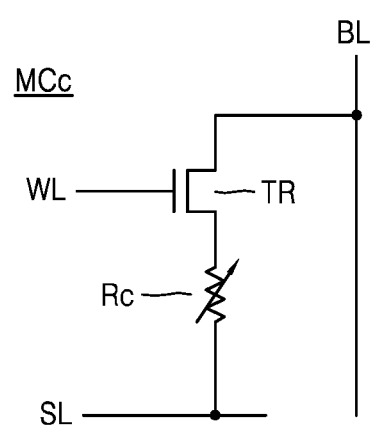

FIGS. 7A through 7C are circuit diagrams illustrating alternative examples of memory cells MC that may be implemented to form memory cell array 110 (and to form the tile TILE of FIG. 6). Referring to FIG. 7A, a memory cell MCa may include a variable resistor Ra, and the variable resistor Ra may be connected between the bit line BL and the word line WL. The memory cell Mca may store data due to voltages respectively applied to the bit line BL and the word line WL.

Referring to FIG. 7B, a memory cell MCb may include a variable resistor Rb and a bidirectional diode Db. The variable resistor Rb may include a resistive material for storing data. The bidirectional diode Db may be connected between the variable resistor Rb and the bit line BL, and the variable resistor Rb may be connected between the word line WL and the bidirectional diode Db. The positions of the bidirectional diode Db and the variable resistor Rb may be switched. The bidirectional diode Db may block a leakage current flowing through a non-selected memory cell.

Referring to FIG. 7C, a memory cell MCc may include a variable resistor Rc and a transistor TR. The transistor TR may act as a selector (i.e., be a switch) for supplying a current to the variable resistor Rc or blocking the current from flowing to the variable resistor Rc, based on a voltage of the word line WL. In the embodiment of FIG. 7C, a source line SL for controlling voltage levels of two ends of the variable resistor Rc may be further provided, in addition to the word line WL. The transistor TR may be connected between the variable resistor Rc and the bit line BL, and the variable resistor Rc may be connected between the source line SL and the transistor TR. The positions of the transistor TR and the variable resistor Rc may be switched. The memory cell MCc may be or not be selected based on whether the transistor TR driven by the word line WL is turned on or off.

Figure 8:
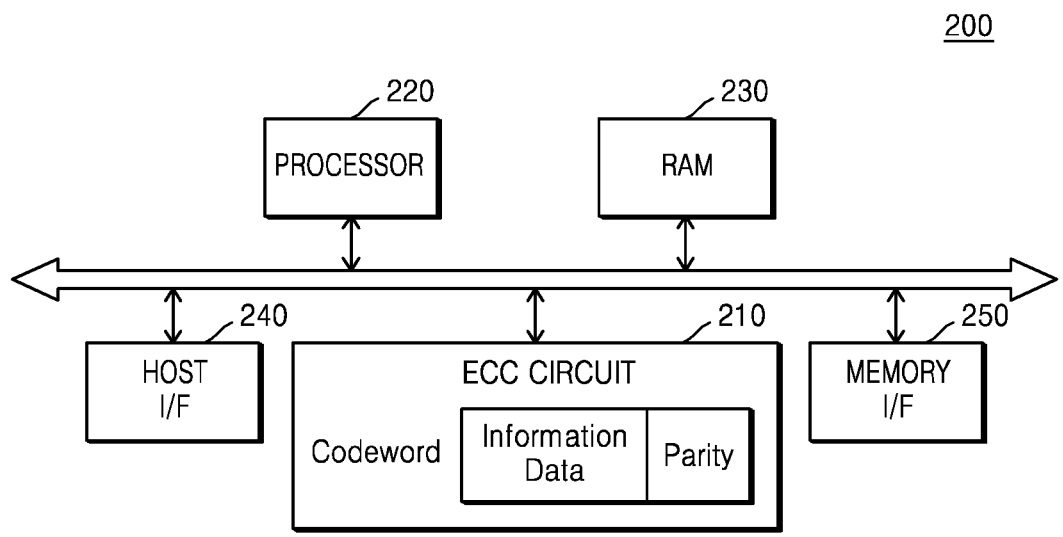
FIG. 8 is a block diagram illustrating, in greater detail, a memory controller included in the memory system of FIG. 4.

FIG. 8 is a block diagram illustrating, in greater detail, the memory controller 200 included in the memory system 10 of FIG. 4.

Referring to FIG. 8, the memory controller 200 may include the ECC circuit 210, a processor 220, RAM 230, a host interface (I/F) 240, and a memory I/F 250. The ECC circuit 210 may generate parity bits (a check code) by performing ECC encoding on information data received from the host HOST during a write operation, generate a codeword, which is a unit in which error correction is performed, and provide the codeword to the memory device 100. The codeword may include the information data and parity bits (e.g., a check code or error correcting code generated by the ECC circuit 210). The information data may have the same format or may be reformatted as compared to its state when received from the host HOST. Similarly, the codeword also may be reformatted in certain examples, such as to provide a codeword having a more balanced number of logic high ("1") bits and logic low ("0") bits (e.g., by processing the codeword output by the ECC circuit 210 using a bit equalization circuit (not shown) using conventional bit equalization methodology prior to storing the codeword in an ECC sector of the memory device). Reformatting may also be in the form of data randomization and/or data encryption and may be implemented using a randomization circuit and/or an encryption circuit (not shown). In some examples, such reformatting may change (e.g., increase) the number of bits of the resulting reformatted codeword (and/or information data). The ECC circuit 210 may perform ECC decoding on the read data, i.e. the codeword, received from the memory device 100 during a read operation, thereby generating information data and providing the information data to the host HOST.

When the number of error bits within the codeword is within a correction capacity, the ECC circuit 210 may correct the bit errors. On the other hand, when the number of error bits within the codeword is beyond the correction capacity, the ECC circuit 210 may not correct the bit errors. As such, a BER unbalance may be a big burden in determining the correction capacity of the ECC circuit 210. If the BER unbalance is able to be reduced, the correction capacity of the ECC circuit 210 may be reduced, and thus the ECC circuit 210 may easily implement an error correction algorithm.

The processor 220 may include a central processing unit (e.g., or a micro-processor), and may control an overall operation of the memory controller 200. In more detail, the processor 220 may be configured by code stored in RAM 230 to control the overall operations of the memory controller, such as controlling timing of operations of the firmware of the memory controller 200. The RAM 230 may be used as an operation memory, a cache memory, or a buffer memory of the processor 220.

The host I/F 240 interfaces with a host HOST to receive a request for a memory operation from the host HOST. For example, the host I/F 240 receives various requests for various operations, such as data read and write requests, from the host that are used by the memory controller 200 to generate various internal signals for the memory operation on the memory device 100.

The memory I/F 250 may provide an interface between the memory controller 200 and the memory device 100. For example, write data and read data may be transmitted and received to and from the memory device 100 through the memory I/F 250. The memory I/F 250 may provide a command and an address to the memory device 100, receive various pieces of information from the memory device 100, and provide the various pieces of information to internal components of the memory controller 200.

Figure 9A:
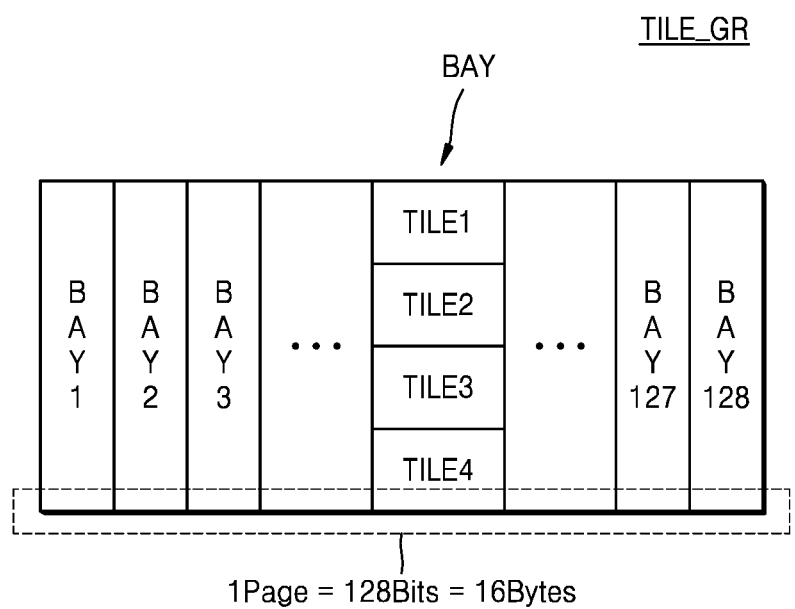
FIG. 9A is a block diagram illustrating exemplary details of a memory cell array that may be included in the memory device of FIGS. 5A and 5B, and FIGS. 9B and 9C illustrate exemplary resistance distribution degradation for a tile group.

FIG. 9A is a block diagram illustrating exemplary details of the memory cell array 110 of FIG. 5A. Each of the bank memory arrays 110a-110d of FIG. 5B may be formed with the structure of FIG. 9A. The memory cell array 110 may be implemented using a memory tile group in which the memory tiles TILE of FIG. 6 are two-dimensionally arranged in a column direction and a row direction. The memory tile group may include a plurality of memory bays BAY, and each of the memory bays BAY may include a plurality of memory tiles TILE (such as a plural ones of the memory tile TILE of FIG. 6) which may be arranged in the column direction of each memory bay BAY. FIG. 9A illustrates 128 memory bays BAY each including 4 memory tiles TILE1 through TILE4. The inventive concept is not limited thereto, and the number of memory bays BAY and the number of memory tiles TILE may vary according to embodiments.

Referring to FIG. 9A, a memory tile group TILE_GR may be set as a memory area from which data is written or read in units of pages. A page means a group of selected memory cells where write and read operations may be performed simultaneously, from among the memory cells connected to a single word line. For example, it is assumed that data bits corresponding to each page are 128 bits (or 16 bytes). In this case, 1-bit data may be written to or read from each of the 128 memory bays BAY commonly connected to one word line within the memory tile group TILE_GR.

Tiles of the group TILE_GR may be spaced apart from each other where certain access circuitry is formed. For example, access circuitry located in areas between tiles may include one or more of sub word line drivers, bit line sense amplifiers, selection circuitry to connect bit lines to I/O lines, word line strapping connections between a word line and plural sub-word lines, etc. Within each tile, the rows of memory cells (and corresponding word lines) may be spaced apart at a first pitch where adjacent memory cell rows (and adjacent word lines) located in different tiles are spaced apart from each other a distance greater than this first pitch to provide room for access circuitry. Similarly, within each tile, the columns of memory cells (and corresponding bit lines) may be spaced apart at a second pitch where adjacent memory cell columns (and adjacent bit lines) located in different tiles are spaced apart from each other a distance greater than this second pitch to provide room for access circuitry. See, e.g., exemplary layouts described with respect to US 2015/0364178 (with sub array blocks SCB) and US 2009/0141567, both of which are herein incorporated by reference.

Figure 10A:
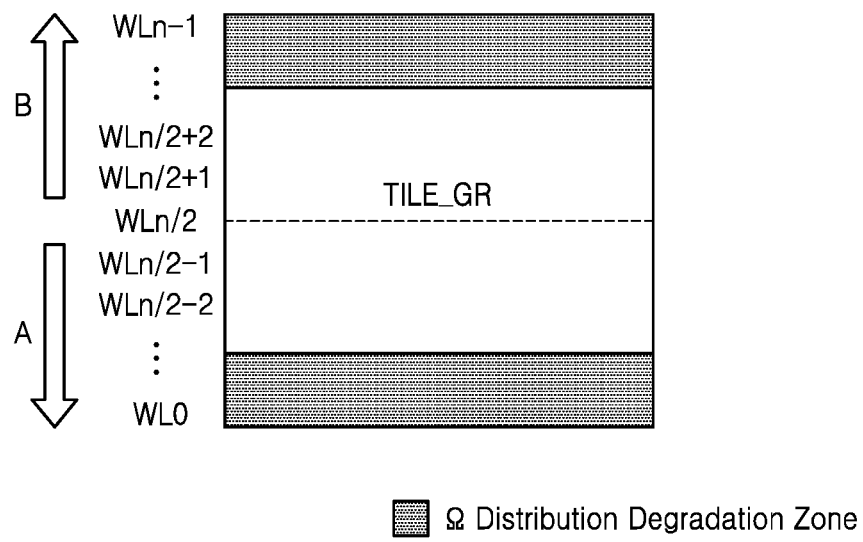
FIGS. 10A through 10D are views for explaining exemplary resistance degradation distribution characteristics of the memory cells in a memory tile group of FIG. 9A.
Figure 10B:
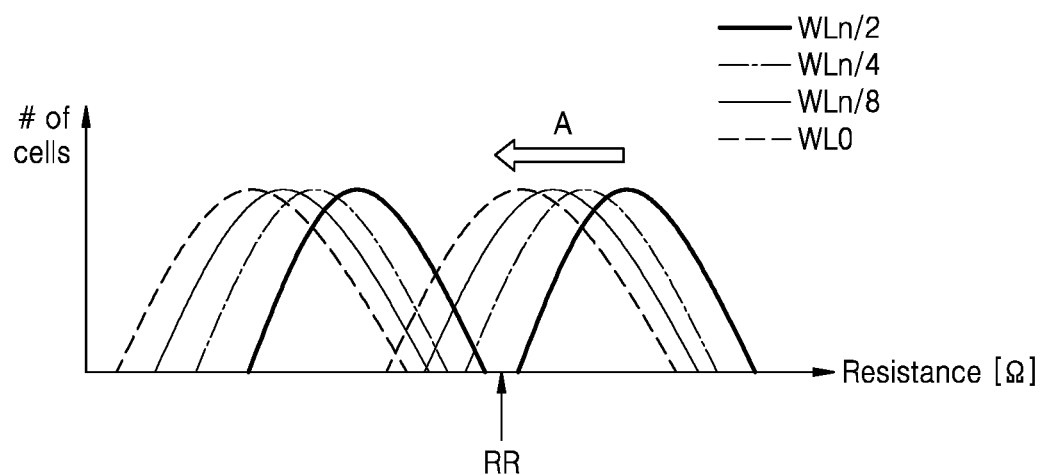
Figure 10C:
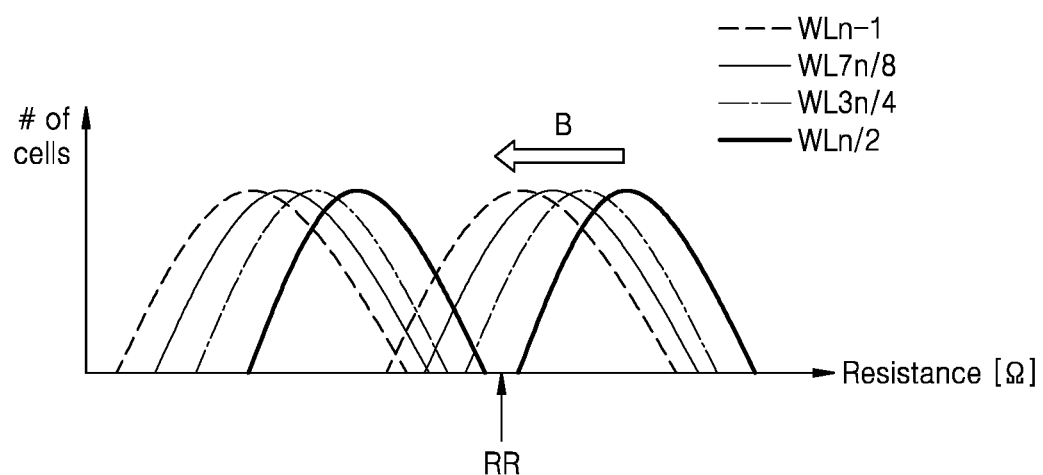

FIGS. 10A through 10C are views for explaining a first example of distribution characteristics of the memory cells in the memory tile group TILE_GR of FIG. 9A. In FIGS. 10B and 10C, the horizontal axis indicates a resistance, and the vertical axis indicates the number of memory cells.

Referring to FIG. 10A, the memory tile group TILE_GR may have a plurality of word lines $WL_0$ through $WL_{n-1}$ sequentially arranged in that order from the bottom to the top of the memory tile group TILE_GR (e.g., with word line $WL_0$ defining a bottom edge and word line $WL_{n-1}$ defining a top edge of the memory tile group TILE_GR). It should be appreciated that reference labels $WL_0$ through $WL_{n-1}$ of FIG. 10A (and similar labels elsewhere in this disclosure) correspond to word line addresses (e.g., row addresses RA). For example, labelling of $WL_0$ through $WL_{n-1}$ in FIG. 10A indicates wordlines corresponding to their addressing (e.g., word lines respectively identified by row addresses $RA_0$ through $RA_{n-1}$). Use of this addressing nomenclature ($WL_0$ through $WL_{n-1}$) also may be used to refer to a particular (i.e. physical) word line (or sets of word lines). It will be appreciated that modification of addressing of word lines does not modify a physical word line, only the identification of the same. Similar identification of bit lines BL is also implemented in this disclosure. It is expected that, as shown in FIG. 3, memory cells connected to each of the word lines $WL_0$ through $WL_{n-1}$ have a low resistance state LRS or a high resistance state HRS (relative to the reference resistance RR).

However, memory cells connected to a word line $WL_{n/2}$, which is at the center of the memory tile group TILE_GR, show a normal resistance distribution as shown in FIG. 3, whereas memory cells connected to the word lines $WL_0$ and $WL_{n-1}$, which are on edges of the memory tile group TILE_GR, show that a resistance distribution widens and/or may shift as shown in FIGS. 10B and 10C. The resistance distribution of a word line may widen for word lines at or closer to edges of the memory tile group TILE_GR (e.g., word lines $WL_0$ and $WL_{n-1}$ may have a wider resistance distribution for memory cells of these word lines as compared to those of word line at the center of the memory tile group TILE_GR (e.g., in this example, $WL_{n/2}$).

Referring to FIG. 10B, in a direction from the word line $WL_{n/2}$, which is at the center of the memory tile group TILE_GR, to the word line $WL_0$, at the lower edge of the memory tile group TILE_GR, resistance of memory cells decreases and a distribution thereof widens and shifts. FIG. 10B also illustrates exemplary resistance distribution widening/shifting for word lines $WL_{n/4}$ and $WL_{n/8}$ respectively located at ¼ and ⅛ of the vertical size (in the column direction) away from the lower edge (in this example, corresponding to $WL_0$) of the memory tile group TILE_GR.

Referring to FIG. 10C, in a direction from the word line $WL_{n/2}$, which is at the center of the memory tile group TILE_GR, to the word line $WL_{n-1}$, at the upper edge of the memory tile group TILE_GR, resistance of memory cells decreases and a distribution thereof widens and shifts. FIG. 10C also illustrates exemplary resistance distribution widening/shifting for word lines $WL_{3n/4}$ and $WL_{7n/8}$ respectively located at ¼ and ⅛ of the vertical size (in the column direction) away from the upper edge (in this example, corresponding to $WL_{n-1}$) of the memory tile group TILE_GR.

In the resistance distribution characteristics of FIGS. 10B and 10C, in a direction toward the lower and upper edges of the memory tile group TILE_GR, resistivity of reset data of memory cells may decrease. The lower and upper edges of the memory tile group TILE_GR belong to a resistance distribution degradation zone. As for the memory cells of the resistance distribution degradation zone, a sensing margin between set data of logic "1" and reset data of logic "0" decreases. Accordingly, sensing of the reset data of logic "0" becomes more uncertain, slower, or generally more unreliable. Consequently, a BER of a word line increases as its location is closer to an edge of a memory tile group. On the contrary, resistivity of reset data of the memory cells located at the center of the memory tile group TILE_GR is relatively maintained, and thus a BER may decrease. When the memory cells on the lower and upper edges having a large BER and the memory cells at the center having a small BER are mixed with each other and then store data, the BER unbalance between such sets of memory cells may be reduced. ECC interleaving operations in which a word line interleaving operation is performed to achieve BER equalization will now be described.

Figure 11C:
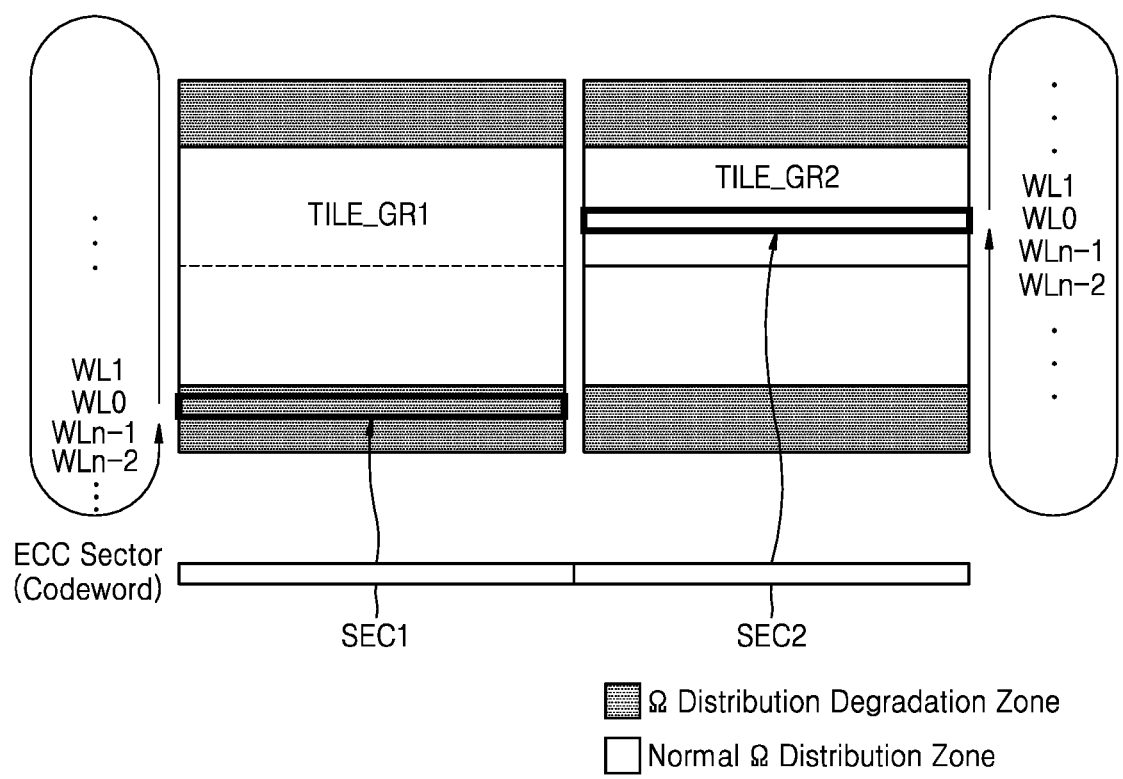

FIGS. 11A through 11C are views for explaining an ECC interleaving operation according to an embodiment of the inventive concept.

Referring to FIG. 11A, a word line interleaving operation may be performed using two memory tile groups TILE_GR of FIG. 9A. The ECC circuit 210 of FIG. 8 may generate a codeword by generating parity bits based on information data received from a host. The information data received from the host may be sectioned into portions that are then used to form ECC sectors. For example, if the ECC circuit 210 is configured to generate parity data to form a codeword of 256 bits, the information data received from the host HOST may be sectioned into a plurality of blocks of 146 bits each. For example, host HOST may send a store command to the memory controller 200 to store a chunk of data (e.g., a 4 MB file) and send 4 MB of information data to the memory controller 200 along with the store command. The chunk of data may be sent by the host HOST as a stream of information data to the memory controller 200. The chunk of information data sent by the host HOST to the memory controller 200 may be divided into a plurality smaller blocks of data (e.g., 146 bits). Each block of data may be sent to ECC circuit 210 (e.g., sent sequentially for sequential processing) and the ECC circuit 210 may generate parity data (e.g., of 110 bits) for each block of data, where block of data and corresponding parity data form a codeword (e.g., of 256 bits). Thus, a plurality of codewords are generated, each codeword comprising a block of information data from host HOST (comprising a portion of the larger chunk of information data sent by the host HOST) and corresponding parity data.

The plurality of codewords sequentially generated by the ECC circuit 210 may be stored sequentially in a single memory device or spread out over a plurality of memory devices, as described elsewhere herein. For example, the memory controller 200 may allocate a section of available memory for storing the plurality of codewords and send one or more write commands to the memory device(s) and the plurality of codewords. The memory controller may send at least one memory address to the memory device(s) identifying the location of memory where the codewords are to be stored by the memory device(s). For example, the memory controller 200 may send to a memory device, a memory address (e.g., comprising a row address and a column address) with each write command, with each write command being associated with a codeword (e.g., a single write command being effective to store a single codeword). In this instance, the memory controller 200, each subsequent write command may be sent with a corresponding incremented memory address and the subsequently sent codeword (such as, for each subsequently sent codeword, sequentially increasing each row address or sequentially increasing each column address). Alternatively, the memory controller 200 may provide to a memory device a start memory address with a burst type write command that identifies the initial location for storing the first codeword and send a sequence of codewords associated with write command. In the burst write command, the memory device may initially store the first codeword at memory portions identified by the start memory address, the second codeword at memory portions identified by the start address+1, the third codeword at memory portions identified by the start address+2, etc. For example, the memory may comprise a row address counter and column address counter, that initially store the start address (e.g., respectively store a start row address and a start column address) sent with a write command from the memory controller 200 with a write command. The row address of the row address counter and the column address counter may be provided to a row decoder and a column decoder, respectively, which decode the same to select a corresponding word line and column where the first codeword is stored. After storing the first codeword at the memory locations identified by the start row address and start column address, one of the column address counter and row address may be incremented and the next codeword may be stored at the memory address identified by this incremented address. Additionally, the other of the column address counter and row address counter may be incremented after certain number of codewords have been written. It should be noted that a single memory address may be used (e.g., sent with a write command) to store a single codeword at plural memory locations identified by the same single memory address (e.g., according to any of the examples described herein with respect to ECC subsectors SEC1 and SEC2), or plural memory addresses may be used (e.g., plural addresses sent with a write command or generated internally by the memory device). In many implementations, the same row address and same column address are used to store the plural ECC subsectors (e.g., SEC1 and SEC2) of a single ECC sector (i.e., to store the plural portions of the codeword at different memory locations) (which may be in the relatively different memory locations according to any of the embodiments described herein).

Other circuitry and methods may be used. In general, the result of storing a chunk of information data may comprise storing a sequence of codewords using a set of word lines identified by a range of row addresses (e.g., in sequential order within the range of row addresses). Similarly, the chunk of information data may comprise storing a sequence of codewords at memory locations identified by a range of column addresses and/or in sequential order of the column addresses.

In storing an ECC sector, the ECC sector is divided into a plurality of portions (ECC sub-sectors). In this example, the ECC sector includes two ECC sub-sectors, namely, first and second ECC sub-sectors SEC1 and SEC2. For example, the ECC sector may be formed of 256 bits (or 32 bytes), and each of the first and second ECC sub-sectors SEC1 and SEC2 may be formed of 128 bits (or 16 bytes).

The first ECC sub-sector SEC1 may be provided to be written to a first memory tile group TILE_GR1, and the second ECC sub-sector SEC2 may be provided to be written to a second memory tile group TILE_GR2. In this case, when a word line interleaving operation is performed, the first ECC sub-sector SEC1 may be written to memory cells selected from the memory cells connected to the word line $WL_0$ located on a lower edge of the first memory tile group TILE_GR1, and the second ECC sub-sector SEC2 may be written to memory cells selected from the memory cells connected to the word line $WL_0$ located at the center of the second memory tile group TILE_GR2.

The word line $WL_0$ in the first memory tile group TILE_GR1 and the word line $WL_0$ in the second memory tile group TILE_GR2 may be located at different distances from respective lower edges of the first and second memory tile groups TILE_GR1 and TILE_GR2. The word line $WL_0$ in the first memory tile group TILE_GR1 may be set as a word line proximate to the lower edge of the first memory tile group TILE_GR1, and the word line $WL_0$ in the second memory tile group TILE_GR2 may be set as a word line distant from the lower edge of the second memory tile group TILE_GR2.

In certain operations, a word line interleaving operation with respect to different memory tiles, write operations (e.g., to write a sequence of ECC sectors sequentially processed by the ECC circuit ECC circuit 210 as described elsewhere herein) may be sequentially performed on the first memory tile group TILE_GR1 in a direction from the word line $WL_0$ located on the lower edge of the first memory tile group TILE_GR1 to the word line $WL_{n-1}$ located on the upper edge thereof. Write operations may be sequentially performed on the second memory tile group TILE_GR2, in a direction from the word line $WL_0$ located at the center of the second memory tile group TILE_GR2 to the word line $WL_{n/2-1}$ located on the upper edge thereof, and then from the word line $WL_{n/2}$ located on the lower edge thereof to the word line $WL_{n-1}$ located at the center thereof. Of course, other operations may be performed to randomly access the word lines of the tile groups TILE_GR1 and TILE_GR2 and other sequences of access operations (including other sequences of write operations) may be implemented.

To perform the word line interleaving operation with respect to different memory tiles, as shown in FIG. 11B, the control circuit 130 of FIGS. 5A and 5B may change word line addressing of one or both of the first memory tile group TILE_GR1 and the second memory tile group TILE_GR1. Sequentially increasing a row addresses RA[i:0] of first memory tile group TILE_GR1 may respectively identify (and sequentially select during an access operation) word lines of the first memory tile group TILE_GR1 in a direction from the word line $WL_0$ located on the lower edge of the first memory tile group TILE_GR1 to the word line $WL_{n-1}$ located on the upper edge of the first memory tile group TILE_GR1. Sequentially increasing a row addresses RA[i:0] of second memory tile group TILE_GR2 may respectively identify (and sequentially select during an access operation) word lines of the second memory tile group TILE_GR2 in a direction from the word line $WL_0$ located on the center of the second memory tile group TILE_GR2 to the word line $WL_{n/2-1}$ located on the upper edge of the second memory tile group TILE_GR2 and then from the word line $WL_{n/2}$ located on the lower edge of the second memory tile group TILE_GR2 to the word line $WL_0\_i$ located at the center of the second memory tile group TILE_GR2 (and immediately adjacent to $WL_0$ also located on the center of the second memory tile group TILE_GR2).

The order of sequential write operations performed in the word line interleaving operation on different memory tiles may be changed. For example, the control circuit 130 may set the word line addressing order of FIG. 11B in a reverse manner such that write operations are sequentially performed on the second memory tile group TILE_GR2 in a direction from the word line $WL_0$ located on the lower edge of the second memory tile group TILE_GR2 to the word line $WL_{n-1}$ located on the upper edge thereof and write operations are sequentially performed on the first memory tile group TILE_GR1 in a direction from the word line $WL_0$ located at the center of the first memory tile group TILE_GR1 to the word line $WL_{n/2-1}$ located on the upper edge thereof and then from the word line $WL_{n/2}$ located on the lower edge thereof to the word line $WL_{n-1}$ located at the center thereof.

Assuming that bit errors occur at relatively high rates in the memory cells on the lower and upper edges of the first and second memory tile groups TILE_GR1 and TILE_GR2 (as compared to memory cells in the middle of these tile groups TILE_GR1 and TILE_GR2), bit errors of the ECC sector may be equalized by being mixed within the memory cells on the lower or upper edges and the memory cells at the centers, after a word line interleaving operation is performed. Accordingly, a BER unbalance between word lines may be reduced by applying the word line interleaving operation with respect to different memory tiles.

The present embodiment shows the ECC sector including two first and second ECC sub-sectors SEC1 and SEC2 that are written to different relative locations within two different tile groups. However, the ECC sector may be divided into other numbers of sub-sectors, and the sub-sectors may be respectively written to memory tile groups at different relative locations in these memory tile groups. In this case, the sub-sectors may be mixed in and written to the memory cells of different memory tile groups via a word line interleaving operation, and thus bit errors of the ECC sector may be equalized. The ECC sector may be divided into n sub-sectors, where n is an integer equal to 2 or more, and each sub-sector may be written into a respective one of n memory tile groups at m different relative locations within each tile group, where m is an integer in the range of 2 to n.

FIG. 11C shows word line addressing that is different from the word line addressing performed in the word line interleaving operation of FIG. 11A.

Referring to FIG. 11C, in the first memory tile group TILE_GR1, the word line $WL_0$ may be one of the word lines belonging to a resistance distribution degradation zone. In the first memory tile group TILE_GR1, the word line $WL_0$ be a word line other than a word line located at the lower edge of the first memory tile group TILE_GR1.

In the second memory tile group TILE_GR2, the word line $WL_0$ may be one of the word lines belonging to a normal resistance distribution zone. In the second memory tile group TILE_GR2, the word line $WL_0$ may be a word line other than a word line located at the center of the second memory tile group TILE_GR2.

When a word line interleaving operation is performed, the first ECC sub-sector SEC1 may be written to memory cells selected from the memory cells connected to the word line $WL_0$ of the first memory tile group TILE_GR1, and the second ECC sub-sector SEC2 may be written to memory cells selected from the memory cells connected to the word line $WL_0$ of the second memory tile group TILE_GR2.

Figure 9B:
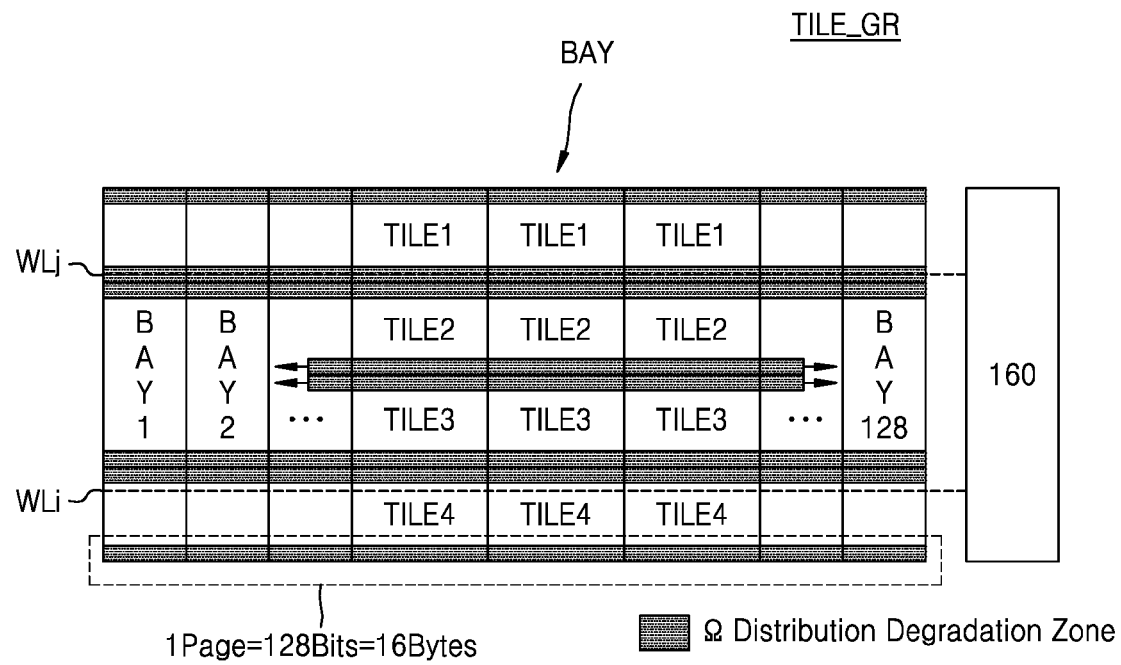
Figure 10D:
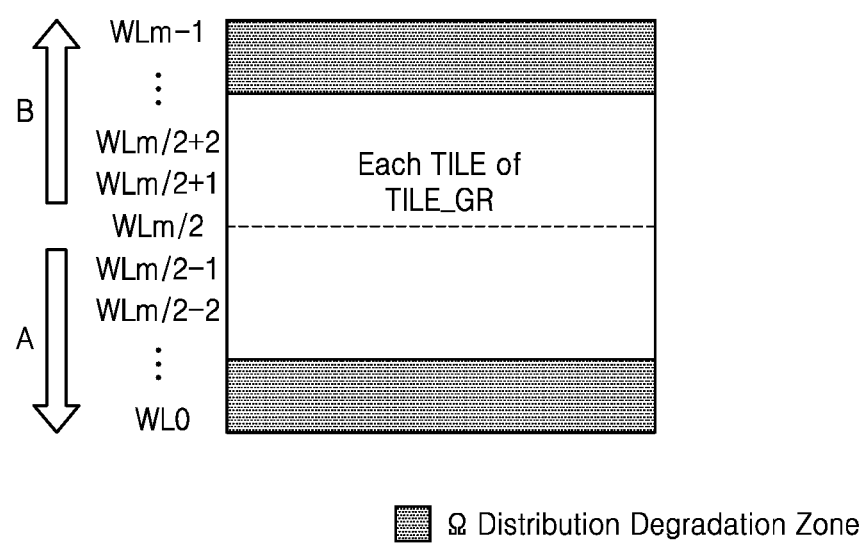

FIG. 10D illustrates an example of ECC interleaving using word line interleaving that may be implemented when a resistance distribution degradation occurs at edges of each tile TILE of a tile group TILE_GR of a memory array. As shown in FIG. 10D, a resistance distribution degradation may occur with respect to memory cells connected to word lines at the top edge and the lower edge of each tile. FIG. 9B illustrates a resistance distribution degradation for the entire tile group TILE_GR when each tile TILE of the tile group TILE_GR includes the resistance distribution degradation shown in FIG. 10D. When word lines connect to memory cell rows of the tile group TILE_GR that extend horizontally through the entire tile group TILE_GR, resistance distribution degradation may occur at higher levels for word lines located adjacent to upper and lower edges of the tiles TILE (such as WLj in FIG. 9B) than those located away from upper and lower edges of the tiles TILE (such as WLi of FIG. 9B).

To balance BER, an ECC sector may be divided into sub-sectors SEC1 and SEC2 and stored in different tile groups TILE_GR1 and TILE_GR2 as described above with respect to FIGS. 11A to 11C where one or both of the row addressing of the word lines of TILE_GR1 and TILE_GR2 are modified so that one of sub-sectors SEC1 and SEC2 is stored on memory cells connected to a word line WL away from upper and lower edges of the tiles TILE whenever the other of sub-sectors SEC1 and SEC2 is stored at locations adjacent to an upper or lower edge of the tiles TILE. For example, assume a row address RA decoded by decoder 160 to select one of the word lines includes i bits. The row address RA may be formed by the bits RA0, RA1, RA2, . . . RAi-3, RAi-2, RAi-1, RAi in the order of lowest significant bit (RA0) to most significant bit (RAi). One of the more significant bits (e.g., one of RAi-3, RAi-2, RAi-1) may be inverted for all row addresses used to access tile group TILE_GR1 to store sub-sector SEC1 while row addressing of TILE_GR2 may remain unmodified. In the example of FIG. 9B, row address bits RAi-1, RAi may be decoded to identify and select one of four horizontal block of tiles contains the word line to be accessed, while row address bits RA0, RA1, RA2, . . . RAi-3, RAi-2 may be decoded to identify and select a word line within the horizontal block (e.g., row address bits RA0, RA1, RA2, . . . RAi-3, RAi-2 may identify word lines WL0 to Wlm-1 shown in FIG. 10D with respect to each tile). In this instance, row address RAi-2 may be inverted for tile group TILE_GR1 and remain unchanged for tile group TILE_GR2. For tile group TILE_GR1, word lines accessed in sequential order corresponding to the sequential order of the row addresses may be in an order from a center of each tile to the top edge of a tile and then from the bottom of each tile to the center of the tile. Corresponding word lines accessed in tile group TILE_GR2 (i.e., for the same row addresses in the same order) may be in the order of the bottom of a tile to the top of the tile. It will be appreciated that the modification of a more significant bit (such as RAi-2 as described above) may be done in conjunction with other address modifications described herein, such as inverting the most significant bit RAi of one of tile groups TILE_GR1 an TILE_GR2 so that other patterns of resistance distribution degradation zones may be spread among portions of the ECC sector to achieve BER balancing.

Figure 12:
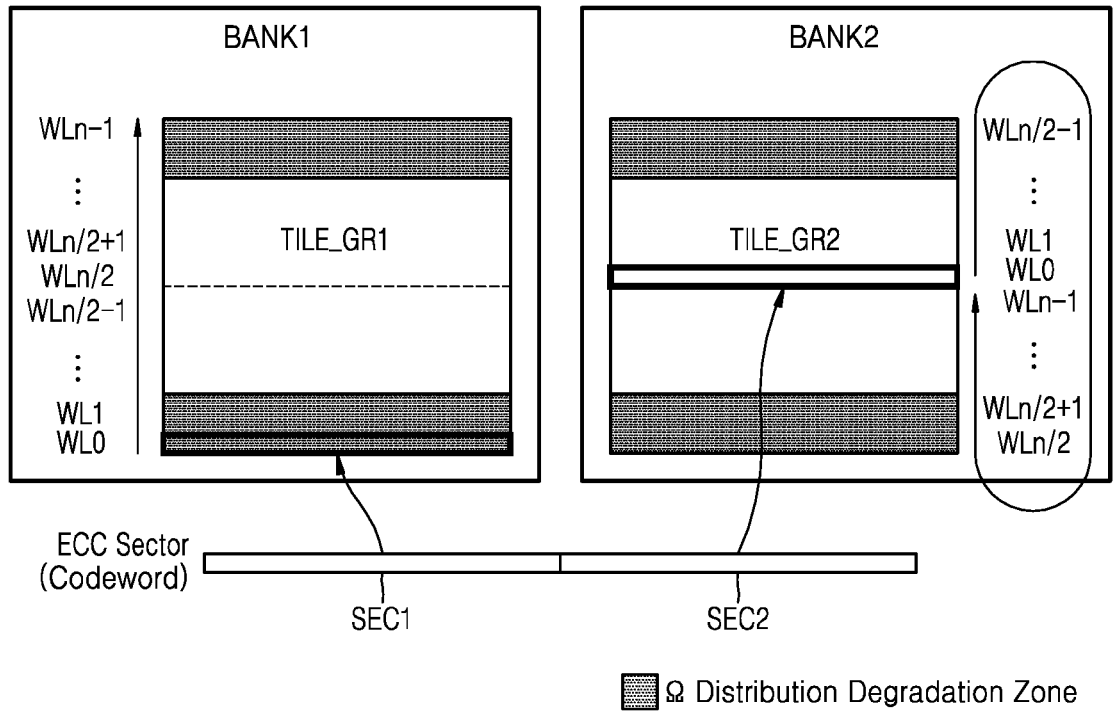
FIG. 12 is a diagram for explaining an ECC interleaving operation according to an embodiment of the inventive concept.

FIG. 12 is a diagram for explaining an ECC interleaving operation according to an embodiment of the inventive concept.

Referring to FIG. 12, a word line interleaving operation with respect to different memory banks is performed. The first memory tile group TILE_GR1 may belong to a first memory bank BANK1, and the second memory tile group TILE_GR2 may belong to a second memory bank BANK2. The first ECC sub-sector SEC1 of the ECC sector may be provided to be written to the first memory tile group TILE_GR1 of the first memory bank BANK1, and the second ECC sub-sector SEC2 may be provided to be written to the second memory tile group TILE_GR2 of the second memory bank BANK2.

In the word line interleaving operation with respect to different memory banks, write operations may be sequentially performed on the first memory tile group TILE_GR1 of the first memory bank BANK1 in a direction from the word line $WL_0$ located on the lower edge of the first memory tile group TILE_GR1 to the word line $WL_{n-1}$ located on the upper edge thereof, and write operations may be sequentially performed on the second memory tile group TILE_GR2 of the second memory bank BANK2 in a direction from the word line $WL_0$ located at the center of the second memory tile group TILE_GR2 to the word line $WL_{n/2-1}$ located on the upper edge thereof and then from the word line $WL_{n/2}$ located on the lower edge thereof to the word line $WL_{n-1}$ located at the center thereof.

To perform the word line interleaving operation with respect to different memory banks, the control circuit 130 of FIGS. 5A and 5B may change word line addressing of at least one of the first memory bank BANK1 and the second memory bank BANK2 as discussed herein.

Figure 5C:
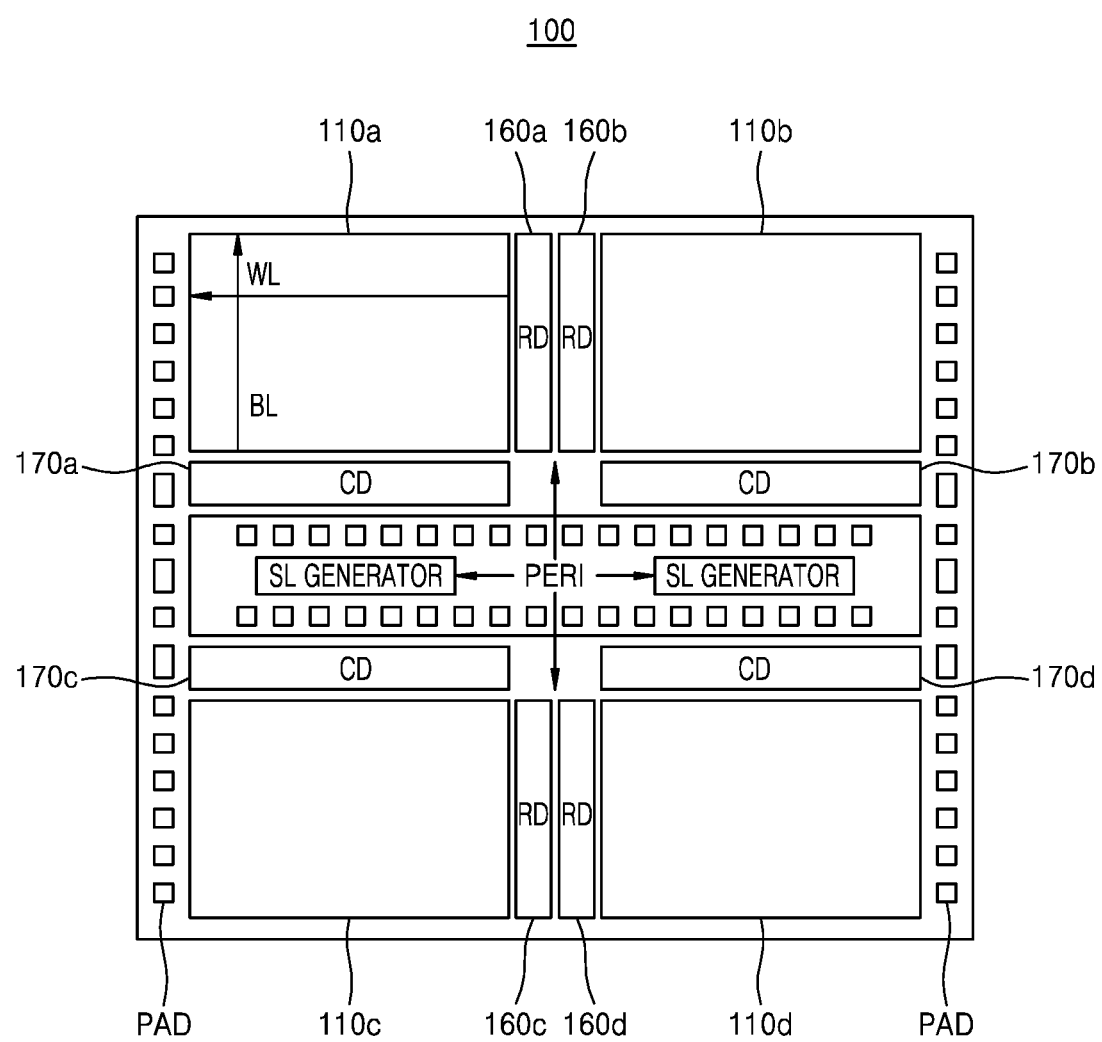
FIG. 5C is top down view of an exemplary layout of the memory device of FIG. 5B.

According to an embodiment, the memory cell array 110 of FIGS. 5A and 5B may include a plurality of memory banks. Referring to FIGS. 5A and 5B, the memory cell array 110 may be disposed adjacent to a peripheral circuit area where circuit blocks other than the memory cell array 110 (e.g., the write/read circuit 120, the control circuit 130, the reference signal generation circuit 140, the voltage generation circuit 150, the row decoder 160, and the column decoder 170) are arranged. FIG. 5C is a top down view showing a layout of an exemplary memory chip with four bank memory arrays 110a to 110d disposed adjacent various peripheral circuits. A BER of the memory cells of a memory bank proximate to the peripheral circuit area from among the plurality of memory banks of the memory cell array 110 may be higher than that of the memory cells of a memory bank distant from the peripheral circuit area. In this case, the first memory bank BANK1 may be set as a memory bank proximate to the peripheral circuit area, and the second memory bank BANK2 may be set as a memory bank distant from the peripheral circuit area. Also, both banks may be disposed adjacent to a peripheral circuit area a word line interleaving operation may be performed so that each row address identifies a first word line in a first bank and a second word line in a second bank, where the distance of the first and second word lines from the peripheral circuit is different to balance the BER. The Vth distribution degradation zone may be formed within the bank memory arrays at locations adjacent the peripheral circuit area.

As the word line interleaving operation with respect to different memory banks is performed, bit errors of the ECC sector may be mixed in the memory cells on the lower or upper edges and the memory cells at the centers and thus bit error rates (BER) may be equalized among the different word lines. Accordingly, a BER unbalance between word lines may be reduced by applying the word line interleaving operation with respect to different memory banks.

Figure 13:
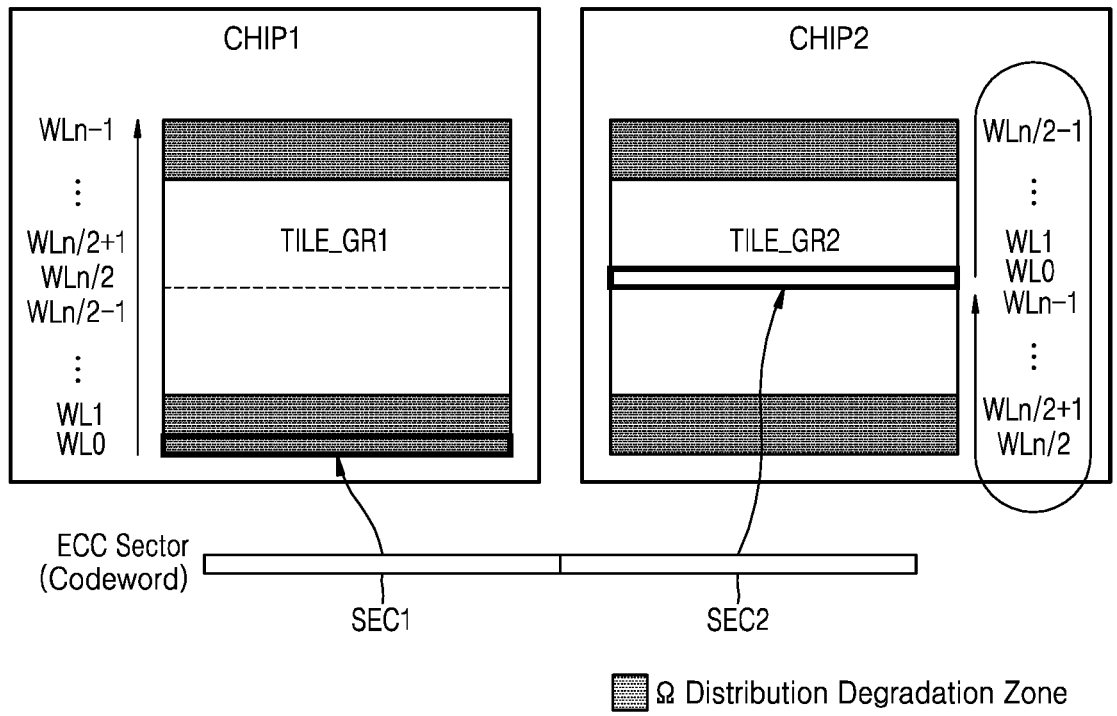
FIG. 13 is a diagram for explaining an ECC interleaving operation according to an embodiment of the inventive concept.

FIG. 13 is a diagram for explaining an ECC interleaving operation according to an embodiment of the inventive concept.

Referring to FIG. 13, a word line interleaving operation with respect to different memory chips is performed. The first memory tile group TILE_GR1 may belong to a first memory chip CHIP1, and the second memory tile group TILE_GR2 may belong to a second memory chip CHIP2. The first ECC sub-sector SEC1 of the ECC sector may be provided to be written to the first memory tile group TILE_GR1 of the first memory chip CHIP1, and the second ECC sub-sector SEC2 may be provided to be written to the second memory tile group TILE_GR2 of the second memory chip CHIP2.

The word line interleaving operation with respect to different memory chips may be applied such that write operations may be sequentially performed on the first memory tile group TILE_GR1 of the first memory chip CHIP1 in a direction from the word line $WL_0$ located on the lower edge of the first memory tile group TILE_GR1 to the word line $WL_{n-1}$ located on the upper edge thereof, and write operations may be sequentially performed on the second memory tile group TILE_GR2 of the second memory chip CHIP2 in a direction from the word line $WL_0$ located at the center of the second memory tile group TILE_GR2 to the word line $WL_{n/2-1}$ located on the upper edge thereof and then from the word line $WL_{n/2}$ located on the lower edge thereof to the word line $WL_{n-1}$ located at the center thereof.

As the word line interleaving operation with respect to different memory chips is performed, bit errors of the ECC sector may be mixed in the memory cells on the lower or upper edges and the memory cells at the centers and thus bit error rates (BER) may be equalized among the different word lines. Specifically, the Vth distribution degradation zone may be at locations of the memory arrays of the memory chips adjacent edges of the memory chips. Accordingly, a BER unbalance between word lines may be reduced by applying the word line interleaving operation with respect to different memory chips.

Figure 14A:
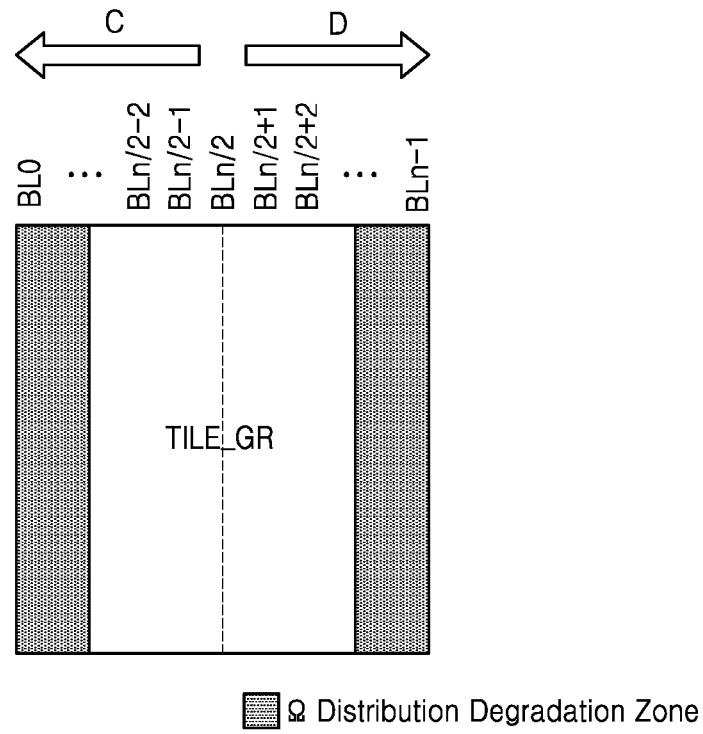
FIGS. 14A through 14C are views for explaining a second example of distribution characteristics of the memory cells in a memory tile group of FIG. 9A.
Figure 14B:
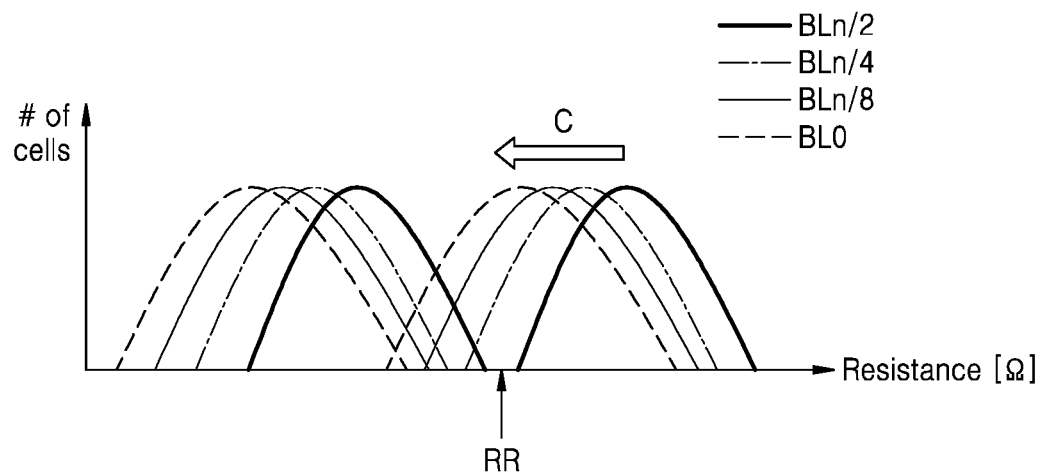
Figure 14C:
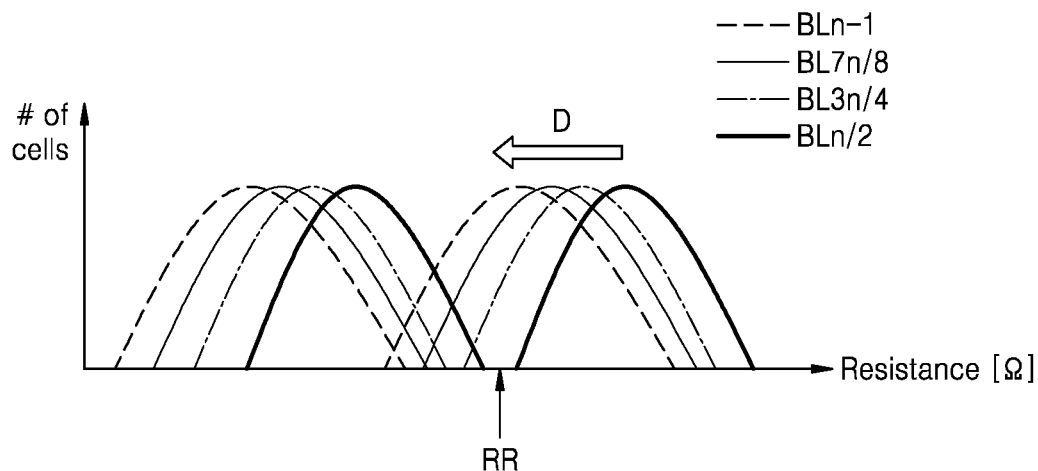

FIGS. 14A through 14C are views for explaining a second example of distribution characteristics of the memory cells in the memory tile group TILE_GR of FIG. 9A. In FIGS. 14B and 14C, the horizontal axis indicates a resistance, and the vertical axis indicates the number of memory cells.

Referring to FIG. 14A, the memory tile group TILE_GR may have a plurality of bit lines $BL_0$ through $BL_{n-1}$. It is expected that, as shown in FIG. 3, memory cells connected to each of the bit lines $BL_0$ through $BL_{n-1}$ have a low resistance state LRS or a high resistance state HRS (relative to the reference resistance RR).

However, memory cells connected to a bit line $BL_{n/2}$, which is at the center of the memory tile group TILE_GR, show normal resistance distribution characteristics as shown in FIG. 3, whereas memory cells connected to the bit lines $BL_0$ and $BL_{n-1}$, which are on edges of the memory tile group TILE_GR, show widened resistance distribution characteristics as shown in FIGS. 14B and 14C.

Referring to FIG. 14B, in a direction from the bit line $BL_{n/2}$, which is at the center of the memory tile group TILE_GR, to the bit line $BL_0$, which is at a left edge of the memory tile group TILE_GR, resistance of memory cells decreases and a distribution thereof widens.

Referring to FIG. 14C, in a direction from the bit line $BL_{n/2}$, which is at the center of the memory tile group TILE_GR, to the bit line $BL_{n-1}$, which is at a right edge of the memory tile group TILE_GR, resistance of memory cells decreases and a distribution thereof widens.

In the resistance distribution characteristics of FIGS. 14B and 14C, in a direction toward the lower and upper edges of the memory tile group TILE_GR, resistivity of reset data of memory cells may decrease. The left and right edges of the memory tile group TILE_GR belong to a resistance distribution degradation zone. As for the memory cells of the resistance distribution degradation zone, a sensing margin between set data of logic "1" and reset data of logic "0" decreases. Accordingly, sensing of the reset data of logic "0" becomes more uncertain, slower, or generally more unreliable. Consequently, a BER increases. On the other hand, resistivity of reset data of the memory cells located at the center of the memory tile group TILE_GR is maintained, and thus a BER may decrease. When the memory cells on the left and right edges having a large BER and the memory cells at the center having a small BER are mixed with each other and then store data, the BER unbalance between bit lines may be reduced. ECC interleaving operations in which bit line interleaving operations are performed to achieve BER equalization will now be described.

FIGS. 15A through 15D are views for explaining an ECC interleaving operation according to an embodiment of the inventive concept.

Figure 15A:
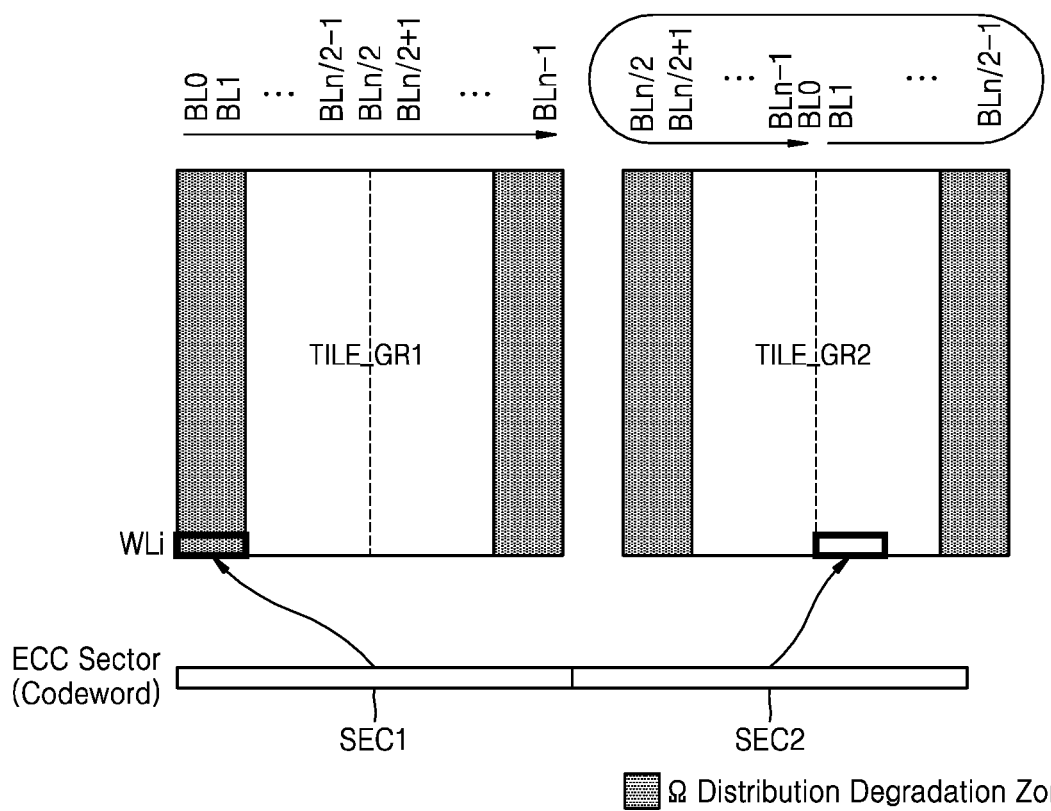
FIGS. 15A through 15D are views for explaining an ECC interleaving operation according to an embodiment of the inventive concept.

Referring to FIG. 15A, a bit line interleaving operation may be performed using two memory tile groups TILE_GR of FIG. 9A. The ECC sector may include the first and second ECC sub-sectors SEC1 and SEC2. A data structure of the ECC sector may include, for example, 256 bits (or 32 bytes), and each of the first and second ECC sub-sectors SEC1 and SEC2 may include 128 bits (or 16 bytes).

The first ECC sub-sector SEC1 may be provided to be written to a first memory tile group TILE_GR1, and the second ECC sub-sector SEC2 may be provided to be written to a second memory tile group TILE_GR2. In this case, when a bit line interleaving operation is performed, the first ECC sub-sector SEC1 may be written to memory cells connected to bit lines $BL_0$ through $BL_{127}$ located on the left edge of the first memory tile group TILE_GR1 from among the memory cells connected to a word line $WL_i$ of the first memory tile group TILE_GR1, and the second ECC sub-sector SEC2 may be written to memory cells connected to bit lines $BL_0$ through $BL_{127}$ located on the center of the second memory tile group TILE_GR2 from among the memory cells connected to a word line $WL_i$ of the second memory tile group TILE_GR2. The word lines $WL_i$ indicate word lines on the same level in the first and second memory tile groups TILE_GR1 and TILE_GR2.

The bit line $BL_0$ in the first memory tile group TILE_GR1 and the bit line $BL_0$ in the second memory tile group TILE_GR2 may be located at different distances from respective left edges of the first and second memory tile groups TILE_GR1 and TILE_GR2. The bit line $BL_0$ in the first memory tile group TILE_GR1 may be set as a bit line proximate to the left edge of the first memory tile group TILE_GR1, and the bit line $BL_0$ in the second memory tile group TILE_GR2 may be set as a bit line distant from the left edge of the second memory tile group TILE_GR2.

In the bit line interleaving operation with respect to different memory tiles, write operations may be sequentially performed on the first memory tile group TILE_GR1 in a direction from the bit line $BL_0$ located on the left edge of the first memory tile group TILE_GR1 to the bit line $BL_{n-1}$ located on the right edge thereof, and write operations may be sequentially performed on the second memory tile group TILE_GR2 in a direction from the bit line $BL_0$ located at the center of the second memory tile group TILE_GR2 to the bit line $BL_{n/2-1}$ located on the right edge thereof and then from the bit line $BL_{n/2}$ located on the left edge thereof to the bit line $BL_{n-1}$ located at the center thereof (immediately adjacent bit line $BL_0$).

Figure 15B:
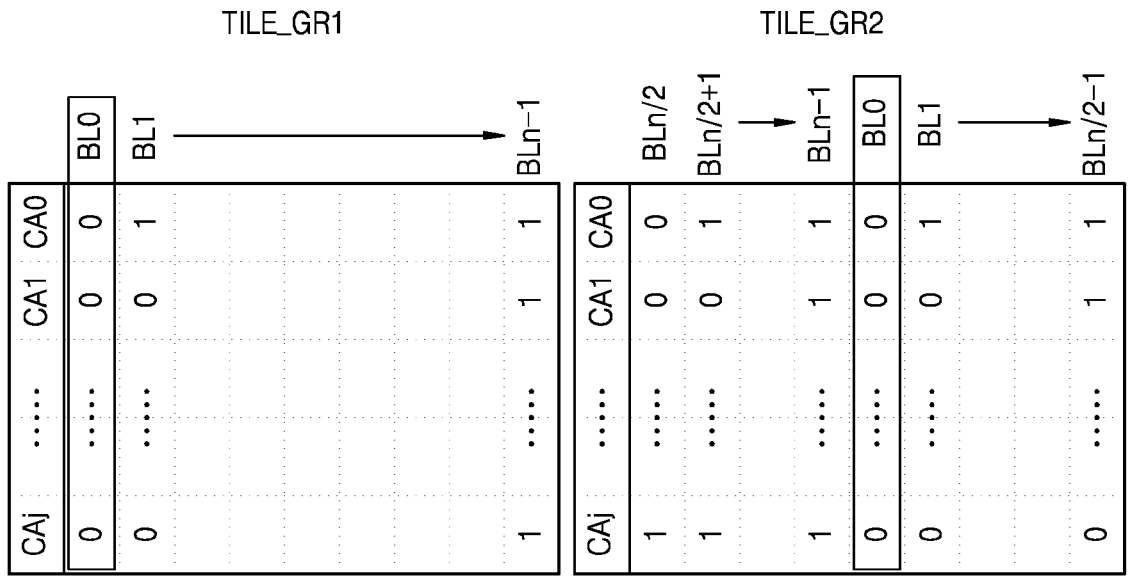

To perform the bit line interleaving operation with respect to different memory tiles, as shown in FIG. 15B, the control circuit 130 of FIGS. 5A and 5B may change bit line addressing of one or both of the first memory tile group TILE_GR1 and second tile group TILE_GR2. Sequentially increasing a column addresses CA[j:0] of the first tile group TILE_GR1 may respectively identify (and sequentially select during an access operation) bit lines of the first tile group TILE_GR1 in a direction from the bit line $BL_0$ located on the left edge of the first memory tile group TILE_GR1 to the bit line $BL_{n-1}$ located on the right edge of the first memory tile group TILE_GR1. Sequentially increasing a column addresses CA[j:0] of the second tile group TILE_GR2 may respectively identify (and sequentially select during an access operation) bit lines of the second tile group TILE_GR2 in a direction from the bit line $BL_0$ located on the center of the second memory tile group TILE_GR2 to the bit line $BL_{n/2-1}$ located on the right edge of the second memory tile group TILE_GR2 and then from the bit line $BL_{n/2}$ located on the left edge of the second memory tile group TILE_GR2 to the bit line $BL_{n-1}$ located at the center of the second memory tile group TILE_GR2.

The order of write operations performed in the bit line interleaving operation on different memory tiles may be changed. For example, the control circuit 130 may set the bit line addressing order of FIG. 15B in a reverse manner such that write operations are sequentially performed on the second memory tile group TILE_GR2 in a direction from the bit line $BL_0$ located on the left edge of the second memory tile group TILE_GR2 to the bit line $BL_{n-1}$ located on the right edge thereof and write operations are sequentially performed on the first memory tile group TILE_GR1 in a direction from the bit line $BL_0$ located at the center of the first memory tile group TILE_GR1 to the bit line $BL_{n/2-1}$ located on the right edge thereof and then from the bit line $BL_{n/2}$ located on the left edge thereof to the bit line $BL_{n-1}$ located at the center thereof. These write operations may each be associated with a different column address that cause an associated selection of one or more bit lines BL by a column decoder. In some examples, a plurality of bit lines BL may be identified by the same column address and a single column address CAi may be decoded by a column decoder and result in the selection and access to a plurality of bit lines at the same time (e.g., to provide or obtain corresponding bits of data from the plurality of bit lines at the same time). Some or all of these plurality of bit lines (identified by a single column address CAi) may access the same memory tile group TILE.

Assuming that bit errors occur at a relatively higher rate in the memory cells on the left and right edges of the first and second memory tile groups TILE_GR1 and TILE_GR2 (as compared to the memory cells in the middle), bit errors of the ECC sector may be equalized by being mixed within the memory cells on the left or right edges and the memory cells at the centers, after a bit line interleaving operation is performed. Accordingly, a BER unbalance between bit lines may be reduced by applying the bit line interleaving operation with respect to different memory tiles.

Figure 15C:
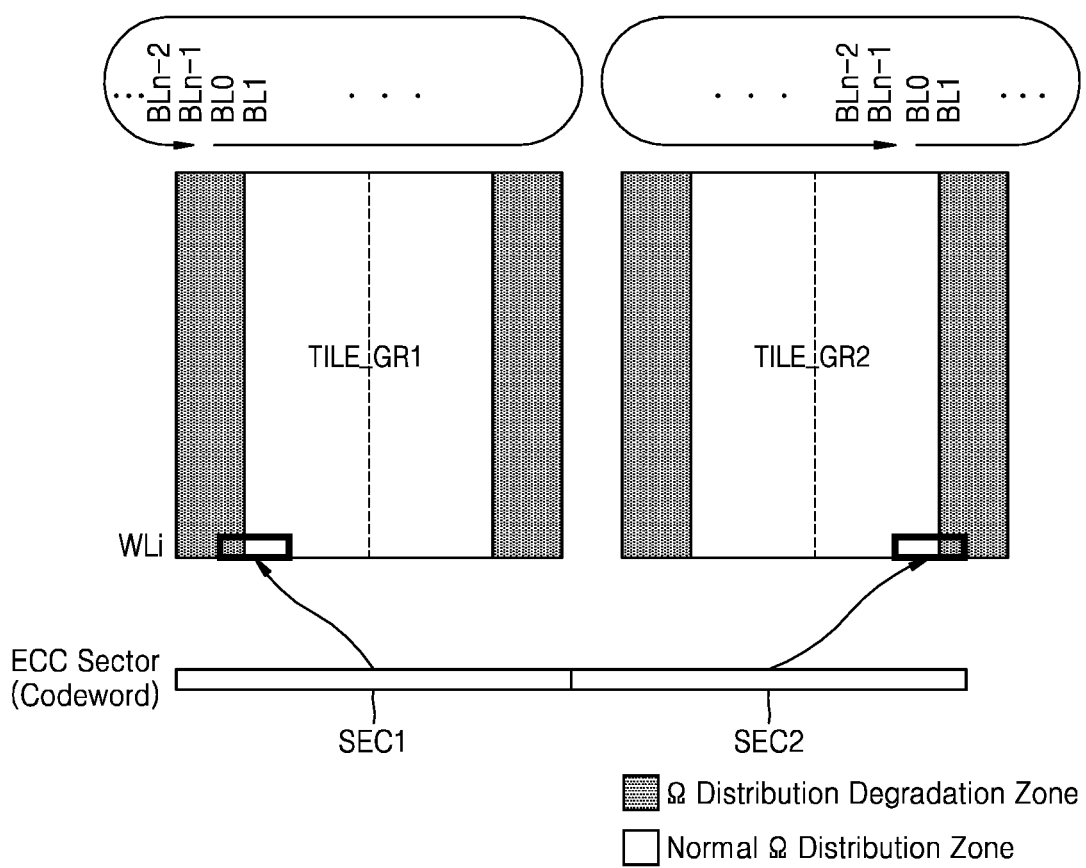

FIG. 15C shows bit line addressing different from the bit line addressing performed in the bit line interleaving operation of FIG. 15A.

Referring to FIG. 15C, in the first memory tile group TILE_GR1, the bit line $BL_0$ may be one of the bit lines belonging to a resistance distribution degradation zone. In the first memory tile group TILE_GR1, the bit line $BL_0$ may be a bit line other than a bit line located on the left edge from among the bit lines belonging to the resistance distribution degradation zone.

In the second memory tile group TILE_GR2, the bit line $BL_0$ may be one of the bit lines belonging to a normal resistance distribution zone. In the second memory tile group TILE_GR2, the bit line $BL_0$ may be a bit line other than a bit line located on the center from among the bit lines belonging to a normal resistance distribution zone.

When a bit line interleaving operation is performed, the first ECC sub-sector SEC1 may be written to memory cells connected to the bit lines $BL_0$ through $BL_{127}$ from among the memory cells connected to the word line $WL_i$ of the first memory tile group TILE_GR1, and the second ECC sub-sector SEC2 may be written to memory cells connected to the bit lines $BL_0$ through $BL_{127}$ from among the memory cells connected to the word line $WL_i$ of the second memory tile group TILE_GR2.

Figure 9C:
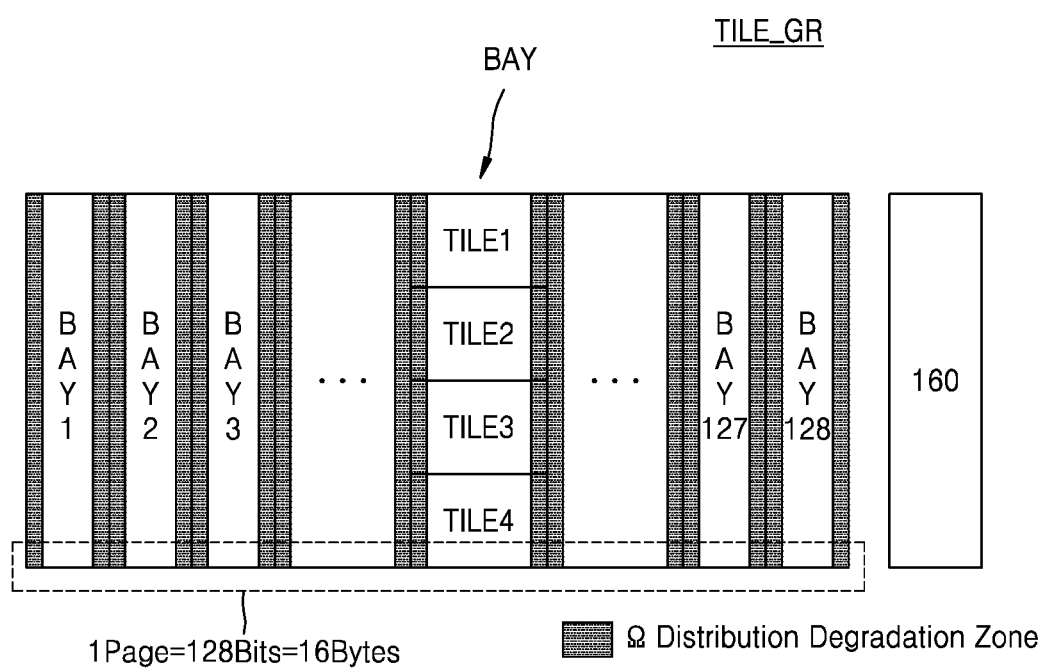

The bit line interleaving operation and address modification described above with respect to FIGS. 15A to 15C may also be used to address resistance distribution degradation that occurs at the vertical edges of each tile TILE. FIG. 9C illustrates an example where the tile group TILE_GR, formed of a two dimensional array of tiles, has resistance distribution degradation at the vertical edges of each tile TILE (and thus, as a result, at the vertical edges of each bay BAY). In accessing memory cells of the TILE_GR, after selecting and activating a word line by row decoder 160 (via decoding a row address RA), column decoder 170 may select a subset of the memory cells connected to the selected word line, such subset of memory cells being identified and selected by the column address CA. In decoding a column address and selecting a subset of the memory cells of a selected word line, one bit line in each bay BAY may be selected and connected to a corresponding I/O line (e.g., using I/O gating 190 of FIG. 5B), such that one bit for each bay BAY is provided in response to each column address (e.g., 128 bits for the TILE_GR of FIG. 9C). However, when the order of bit line selection is the same (e.g., with respect to lower significant bits of a column address), a column address may select bit lines (and thus memory cells) that have the same relative location within each of their corresponding bays. For example, as shown in FIG. 9C, a column address CAi may select bit lines that are all at the left edge of their corresponding bay while a column address of CAj may select bit lines that are all at a middle location of their bays. Thus, resulting data bits provided by such access operation may have different resistance degradation rates in dependence on their column addressing.

Figure 15D:
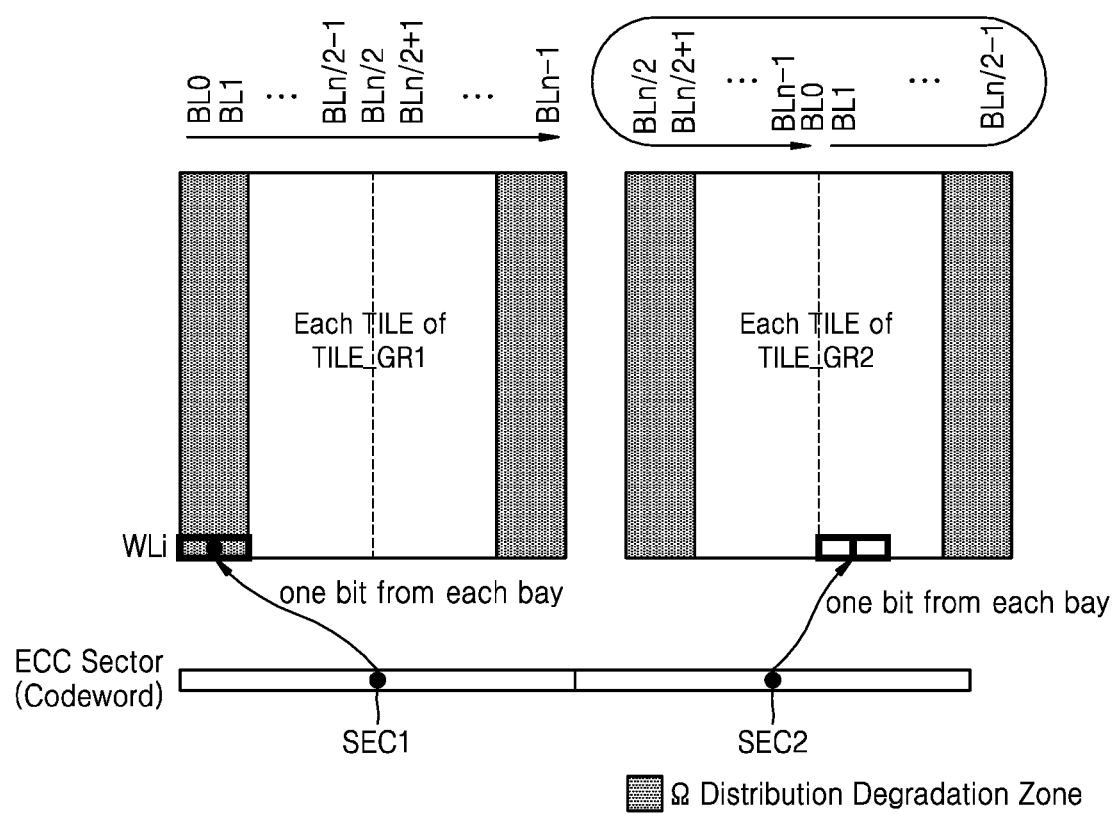

The column addressing modification described with respect to FIG. 15A to 15C may be implemented to address a resulting BER imbalance. As represented by FIG. 15D, by modifying one of the column addresses CA of one or both of the tile groups TILE_GR1 and TILE_GR2 as described, when one set of bits (e.g., 128 bits of sub-sector SEC1) provided by one of the tile groups (e.g., TILE_GR1) provides bits from memory cells that are all in a corresponding resistance distribution degradation zone (e.g. adjacent a vertical edge of corresponding tiles), the other of the tile groups (e.g., TILE_GR2) will provide a set of bits (e.g., 128 bits of sub-sector SEC2) that are located outside such a resistance distribution degradation zone (e.g., in the middle of corresponding tiles). Thus, resistance distribution degradation of each codeword (formed by the combined sub-sectors SEC1 and SEC2) will be balanced, resulting in BER balancing.

Figure 16:
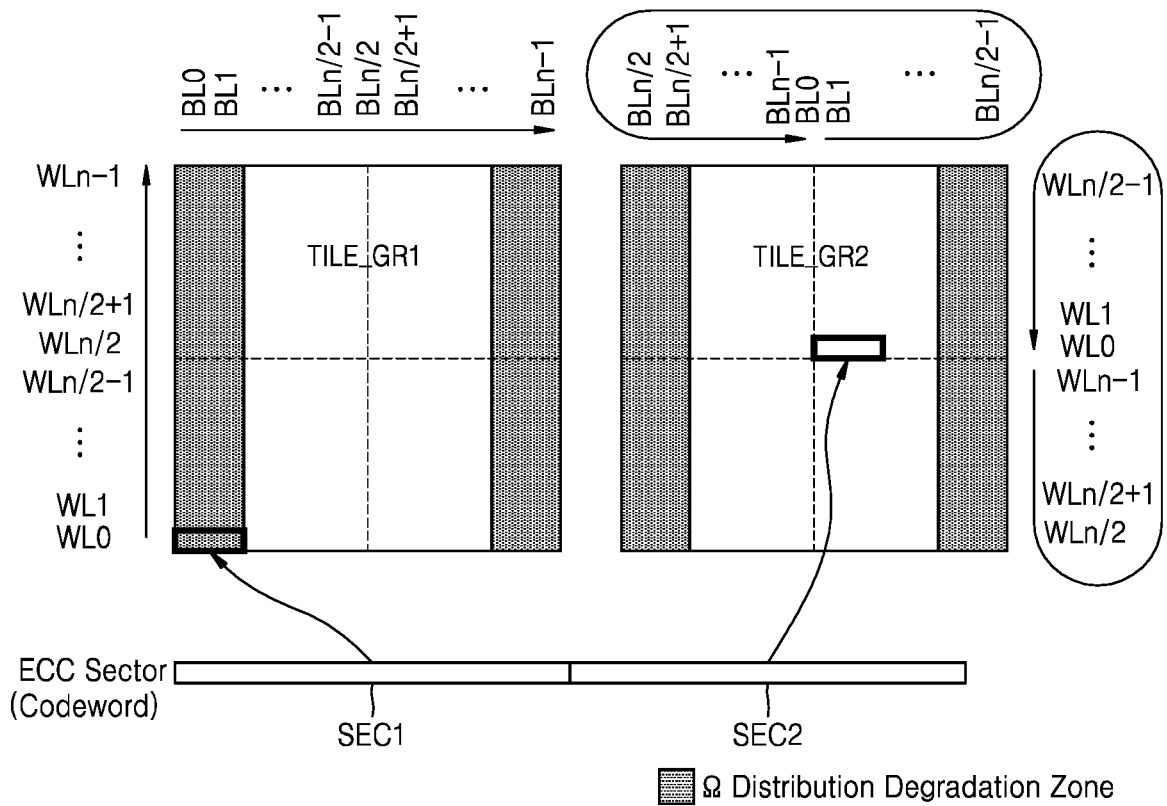
FIG. 16 is a diagram for explaining an ECC interleaving operation according to an embodiment of the inventive concept.

FIG. 16 is a diagram for explaining an ECC interleaving operation according to an embodiment of the inventive concept.

Referring to FIG. 16, a convolution interleaving operation may be performed using two memory tile groups TILE_GR of FIG. 9A. The convolution interleaving operation may be achieved by synthetically performing the word line interleaving operation of FIG. 11A and the bit line interleaving operation of FIG. 15A. The ECC sector may include the first and second ECC sub-sectors SEC1 and SEC2.

The first ECC sub-sector SEC1 may be provided to be written to a first memory tile group TILE_GR1, and the second ECC sub-sector SEC2 may be provided to be written to a second memory tile group TILE_GR2. In this case, when a convolution interleaving operation is performed, the first ECC sub-sector SEC1 may be written to memory cells connected to bit lines $BL_0$ through $BL_{127}$ located on the left edge of the first memory tile group TILE_GR1 from among the memory cells connected to a word line $WL_0$ located on the lower edge of the first memory tile group TILE_GR1, and the second ECC sub-sector SEC2 may be written to memory cells connected to bit lines $BL_0$ through $BL_{127}$ located on the center of the second memory tile group TILE_GR2 from among the memory cells connected to a word line $WL_0$ located at the center of the second memory tile group TILE_GR2.

In a convolution interleaving operation with respect to different memory tiles, the described write operations that may be sequentially performed on the first memory tile group TILE_GR1 in a direction from the word line $WL_0$ located on the lower edge of the first memory tile group TILE_GR1 to the word line $WL_{n-1}$ located on the upper edge thereof and the described write operations that may be sequentially performed on the first memory tile group TILE_GR1 in a direction from the bit line $BL_0$ located on the left edge of the first memory tile group TILE_GR1 to the bit line $BL_{n-1}$ located on the right edge thereof may be combined. In addition, the described write operations sequentially performed on the second memory tile group TILE_GR2 in a direction from the word line $WL_0$ located at the center of the second memory tile group TILE_GR2 to the word line $WL_{n/2-1}$ located on the upper edge thereof and then from the word line $WL_{n/2}$ located on the lower edge thereof to the word line $WL_{n-1}$ located at the center thereof, and the described write operations sequentially performed on the second memory tile group TILE_GR2 in a direction from the bit line $BL_0$ located at the center of the second memory tile group TILE_GR2 to the bit line $BL_{n/2-1}$ located on the right edge thereof and then from the bit line $BL_{n/2}$ located on the left edge thereof to the bit line $BL_{n-1}$ located at the center thereof may be combined.

To perform the convolution interleaving operation with respect to different memory tiles, the control circuit 130 of FIGS. 5A and 5B may change word line addressing and bit line addressing of one or both of the first memory tile group TILE_GR1 and the second memory tile group TILE_GR2.

As the convolution interleaving operation with respect to different memory tiles is performed, bit errors of the ECC sector may be mixed in the memory cells on the lower or upper edges and the memory cells at the centers and may be equalized among the ECC sectors. Accordingly, a BER unbalance between word lines and bit lines may be reduced by applying the convolution interleaving operation.

Figure 17A:
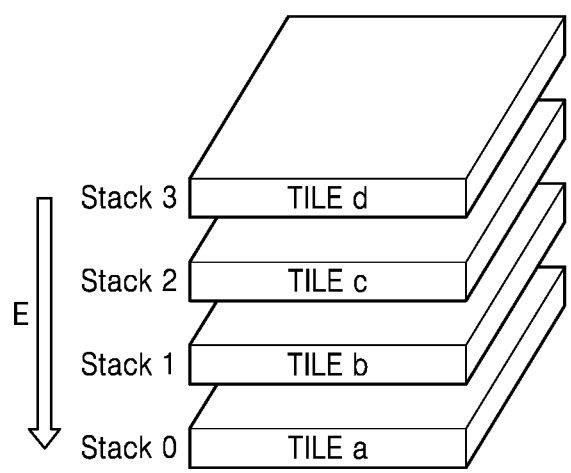
FIGS. 17A and 17B are views for explaining distribution characteristics of memory cells in a three-dimensional (3D) structure in which memory tiles of FIG. 6 are vertically stacked.
Figure 17B:
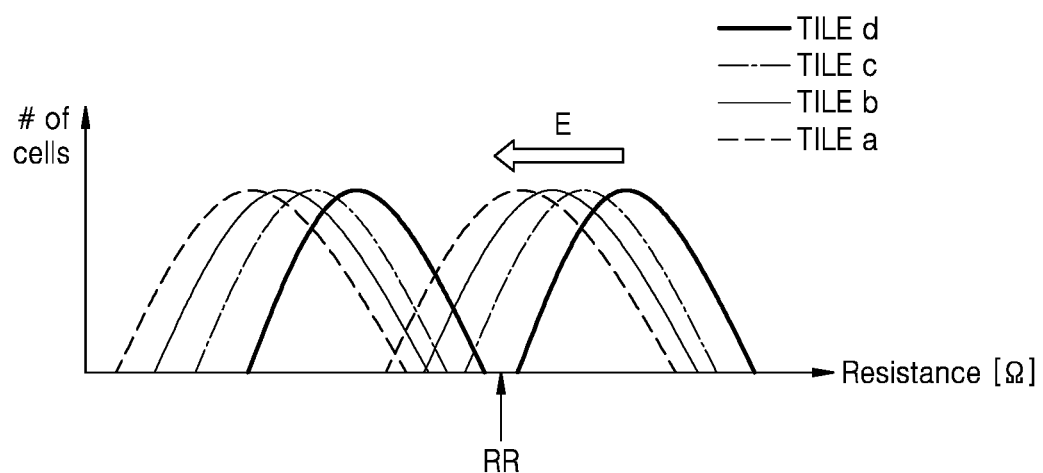

FIGS. 17A and 17B are views for explaining distribution characteristics of memory cells in a three-dimensional (3D) structure in which memory tiles TILE of FIG. 6 are vertically stacked. In FIG. 17B, the horizontal axis indicates a resistance, and the vertical axis indicates the number of memory cells. The memory tiles TILE of FIG. 6 may be stacked in a height direction. Each of memory tiles TILEa through TILEd may have a 3D structure in which each memory tile extends in a column direction, a row direction, and a height direction.

Referring to FIG. 17A, the stacked memory tiles TILEa through TILEd may be commonly connected to each other via a plurality of global bit lines. Word lines belonging to each of the memory tiles TILEa through TILEd may be independent from other memory tiles. It is expected that, as shown in FIG. 3, memory cells of each of the memory tiles TILEa through TILEd have a low resistance state LRS or a high resistance state HRS (relative to the reference resistance RR).

However, the memory cells of the memory tile TILEd located on an upper end from among the stacked memory tiles TILEa through TILEd may show a normal resistance distribution as shown in FIG. 3, whereas memory cells of the memory tile TILEa located on a lower end from among the stacked memory tiles TILEa through TILEd may show that a resistance distribution widens as shown in FIG. 17B.

Referring to FIG. 17B, in a direction from the memory tile TILEd located on the upper end to the memory tile TILEa located on the lower end, resistance of the memory cells decreases and a distribution thereof widens.

In the resistance distribution of FIG. 17B, in a direction toward the memory tiles TILEc, TILEb, and TILEa in a lower portion from among the stacked memory tiles TILEa through TILEd, a BER may increase and a BER of the memory tile TILEd located on the upper end may decrease. When the memory cells of the memory tile TILEa located on the lower end and having a large BER and the memory cells of the memory tile TILEd located on the upper end and having a small BER are mixed with each other and then store data, the BER unbalance may be reduced. ECC interleaving operations in which a stack layer interleaving operation is performed to achieve BER equalization will now be described.

Figure 18:
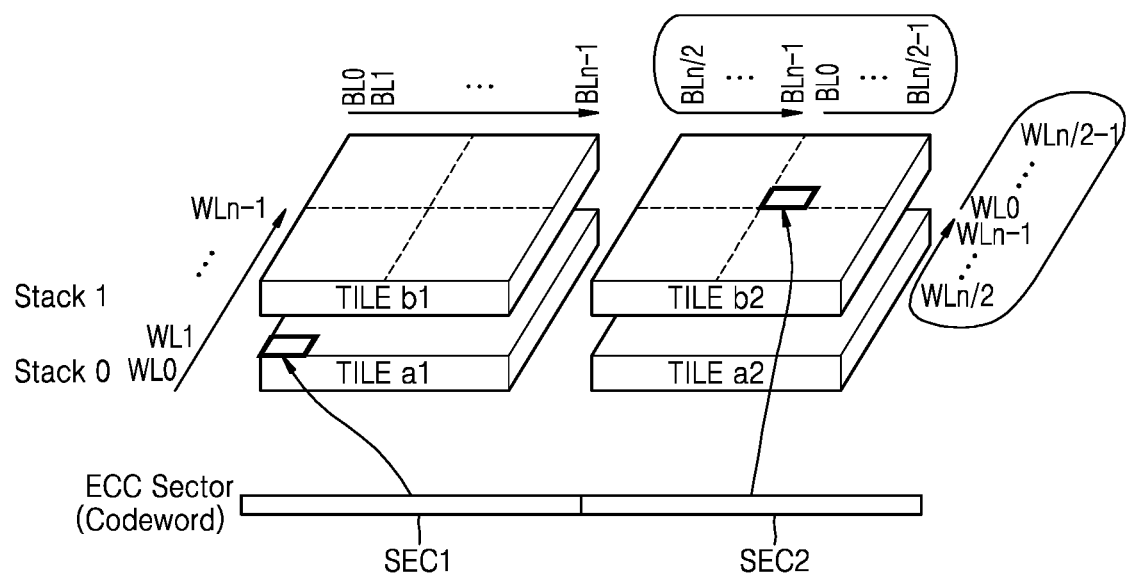
FIG. 18 is a diagram for explaining an ECC interleaving operation according to an embodiment of the inventive concept.

FIG. 18 is a diagram for explaining an ECC interleaving operation according to an embodiment of the inventive concept. In FIG. 18, the memory device 100 may be formed from a stack of memory tiles. More specifically, the memory device 100 may be formed from a stack of stack layers, wherein each stack layer comprises a two dimensional array of memory tiles (such as described with respect to FIG. 9A). For ease of explanation, only stack layers Stack0 and Stack1 are shown, and only two tiles are shown for each of these stack layers. However, additional stack layers and memory tiles per stack layer are contemplated. Each stack layer may comprise a separate semiconductor chip, with the stacks interconnected through TSV's (through substrate vias). Alternatively, all (or some of the adjacent ones) of the stack layers may be formed in a single semiconductor chip.

Referring to FIG. 18, a first memory tile TILEa1 and a second memory tile TILEa2 may be arranged on a first stack layer Stack0, which is a lower portion. A third memory tile TILEb1 and a fourth memory tile TILEb2 may be arranged on a second stack layer Stack1, which is an upper portion. The third memory tile TILEb1 may be stacked on the first memory tile TILEa1 of the first stack layer Stack0, and the fourth the memory tile TILEb2 may be stacked on the second memory tile TILEa2 of the first stack layer Stack0.

In the stacked first though fourth memory tiles TILEa1 through TILEb2, a stack layer interleaving operation may be performed by applying the convolution interleaving operation of FIG. 16. The ECC sector may include the first and second ECC sub-sectors SEC1 and SEC2.

The first ECC sub-sector SEC1 may be provided to be written to the first memory tile TILEa1 of the first stack layer Stack0, and the second ECC sub-sector SEC2 may be provided to be written to the fourth memory tile TILEb2 of the second stack layer Stack1. In this case, when a stack layer interleaving operation is performed, the first ECC sub-sector SEC1 may be written to memory cells connected to bit lines $BL_0$ through $BL_{127}$ located on a left edge of the first memory tile TILEa1 from among the memory cells connected to a word line $WL_0$ located on a lower edge of the first memory tile TILEa1, and the second ECC sub-sector SEC2 may be written to memory cells connected to bit lines $BL_0$ through $BL_{127}$ located at a center of the fourth memory tile TILEb2 from among the memory cells connected to a word line $WL_0$ located at the center of the fourth memory tile TILEb2.

In a stack layer interleaving operation with respect to different memory tiles, write operations may be sequentially performed on the first memory tile TILEa1 in a direction from the word line $WL_0$ located on the lower edge of the first memory tile TILEa1 to the word line $WL_{n-1}$ located on an upper edge thereof and write operations may be sequentially performed on the first memory tile TILEa1 in a direction from the bit line $BL_0$ located on the left edge of the first memory tile TILEa1 to the bit line $BL_{n-1}$ located on the right edge thereof may be combined. In addition, write operations may be sequentially performed on the fourth memory tile TILEb2 in a direction from the word line $WL_0$ located at the center of the fourth memory tile TILEb2 to the word line $WL_{n/2-1}$ located on the upper edge thereof and then from the word line $WL_{n/2}$ located on the lower edge thereof to the word line $WL_{n-1}$ located at the center thereof, and write operations may be sequentially performed on the fourth memory tile TILEb2 in a direction from the bit line $BL_0$ located at the center of the fourth memory tile TILEb2 to the bit line $BL_{n/2-1}$ located on the right edge thereof and then from the bit line $BL_{n/2}$ located on the left edge thereof to the bit line $BL_{n-1}$ located at the center thereof may be combined.

To perform a stack layer interleaving operation on stacked memory tiles, the control circuit 130 of FIGS. 5A and 5B may change one or both of word line addressing and bit line addressing of one or more of the stacked first though fourth memory tiles TILEa through TILEb2.

As the stack layer interleaving operation with respect to stacked memory tiles is performed, bit errors of the ECC sector may be mixed in the memory cells of a lower memory tile and the memory cells of an upper memory tile from among the stacked memory tiles and may be equalized. Accordingly, a BER unbalance between stacked memory tiles may be reduced by applying the stack layer interleaving operation.

Figure 19:
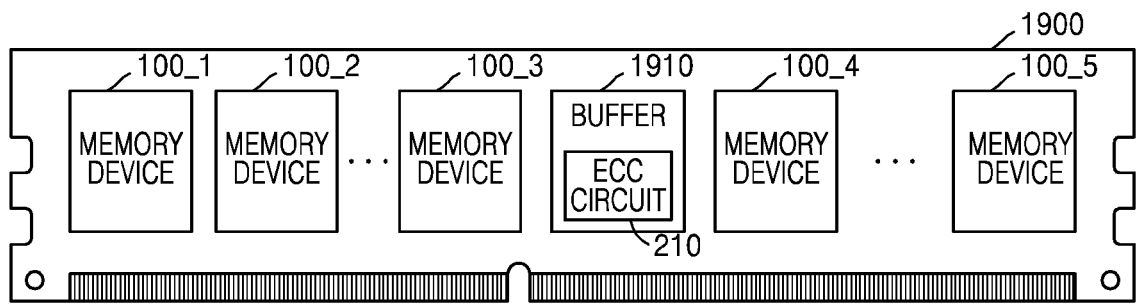
FIG. 19 is a schematic diagram of a memory module including a memory device, according to an embodiment of the inventive concept.

FIG. 19 is a schematic diagram of a memory module 1900 including a memory device, according to an embodiment of the inventive concept.

Referring to FIG. 19, the memory module 1900 may include a plurality of memory chips 100_1 through 100_5. The plurality of memory chips 100_1 through 100_5 may be the same as or similar to the memory device 100 of FIGS. 5A and/or 5B.

The memory module 1900 may include a buffer 1910 that receives and buffers a command, an address, and data from the memory controller 200 of FIG. 8 via a plurality of signal lines, and provide the command, the address, and the data to the memory chips 100_1 through 100_5. The buffer 1910 may include an ECC circuit 210 that is the same as or similar to the ECC circuit 210 of FIG. 8. The ECC circuit 210 may perform ECC encoding on information data received by the memory module 1900 during a write operation, thereby generating a codeword and providing the codeword to memory chip(s) selected from the memory chips 100_1 through 100_5. The ECC circuit 210 may perform ECC decoding on read data, i.e. the codeword, received from the memory chip(s) selected from the memory chips 100_1 through 100_5, during a read operation, thereby generating information data and providing the information data to the memory controller 200.

The buffer 1910 may perform the word line interleaving operation on different memory chips described above with reference to FIG. 13. In connection with FIG. 13, the first memory tile group TILE_GR1 may belong to a first memory chip 100_1, and the second memory tile group TILE_GR2 may belong to a second memory chip 100_2. The buffer 1910 may provide the first ECC sub-sector SEC1 of the ECC sector to be written to the first memory tile group TILE_GR1 of the first memory chip 100_1, and the second ECC sub-sector SEC2 thereof to be written to the second memory tile group TILE_GR2 of the second memory chip 100_2 at different relative locations within the first and second tile groups TILE_GR1 and TILE_GR2 as described herein.

In the word line interleaving operation with respect to different memory chips, write operations may be sequentially performed on the first memory tile group TILE_GR1 of the first memory chip 100_1 in a direction from the word line $WL_0$ located on the lower edge of the first memory tile group TILE_GR1 to the word line $WL_{n-1}$ located on the upper edge thereof, and write operations may be sequentially performed on the second memory tile group TILE_GR2 of the second memory chip 100_2 in a direction from the word line $WL_0$ located at the center of the second memory tile group TILE_GR2 to the word line $WL_{n/2-1}$ located on the upper edge thereof and then from the word line $WL_{n/2}$ located on the lower edge thereof to the word line $WL_{n-1}$ located at the center thereof. The interleaving operations other than the word line interleaving operation may be performed instead of or in addition to the word line interleaving operation with respect to the first and second tile groups TILE_GR1 and TILE_GR2 in a manner as described herein.

Figure 20:
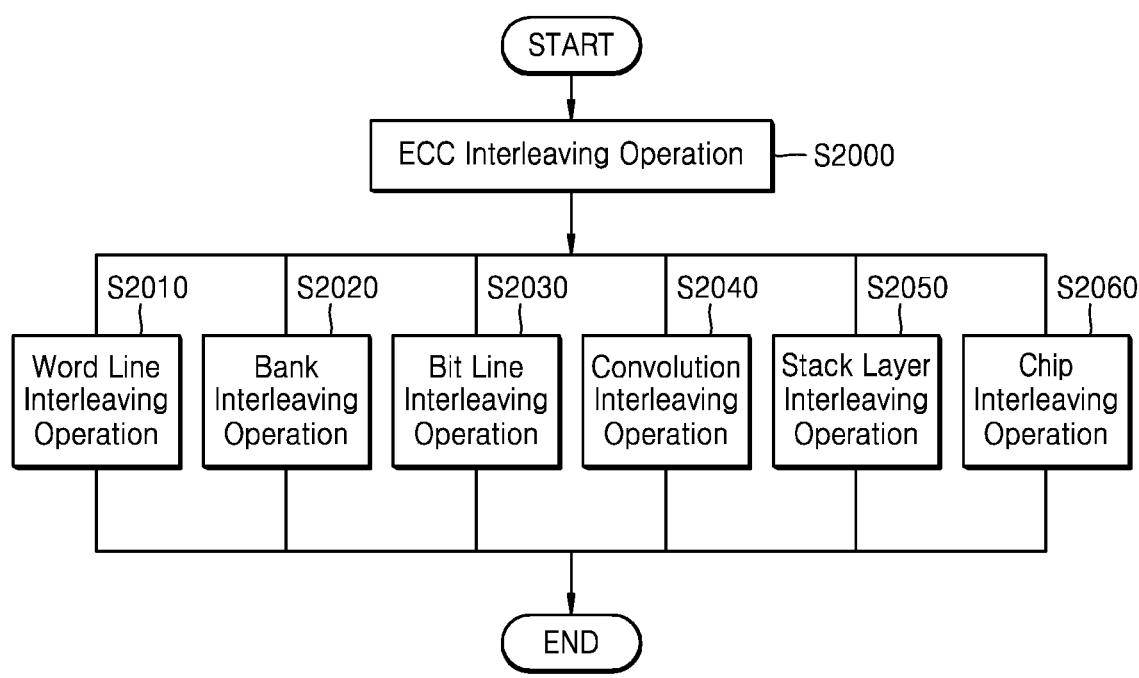
FIG. 20 is a flow chart of an ECC interleaving operation of a memory device, according to an embodiment of the inventive concept.

FIG. 20 is a flow chart of an ECC interleaving operation of a memory device, according to an embodiment of the inventive concept.

Referring to FIG. 20, in operation S2000, when the memory device 100 of FIG. 5A is turned on, the ECC interleaving operation starts. For example, the ECC interleaving operation may start during a write operation or a read operation of the memory device 100. According to an embodiment, the ECC interleaving operation may be started according to distribution characteristics of the memory cells within the memory cell array 110 described above with reference to FIGS. 10A through 10C, FIGS. 14A through 14C, and FIGS. 17A and 17B.

When the ECC interleaving operation starts in operation S2000, the memory device 100 may receive a codeword including information data and one or more parity bits of the information data and may divide an ECC sector including the information data into at least two ECC sub-sectors. When the memory device 100 writes the codeword to a memory cell array including a plurality of memory tiles, the memory device 100 may write one of the at least two ECC sub-sectors to a first memory area having a high BER and may write another one of the at least two ECC sub-sectors to a second memory area having a low BER. The memory device 100 may perform one or more of a word line interleaving operation (S2010), a bank interleaving operation (S2020), a bit line interleaving operation (S2030), a convolution interleaving operation (S2040), and a stack layer interleaving operation (S2050) such that BERs of pieces of information data written to the first memory area and the second memory area may be equalized. The ECC interleaving operation may include a chip interleaving operation (S2060).

In the word line interleaving operation (S2010), information data may be mixed in memory cells connected to a first word line of the first memory area and memory cells connected to a second word line of the second memory area and may be written thereto (e.g., in a manner as described herein).

In the bank interleaving operation (S2020), information data may be mixed in memory cells connected to a first word line of a first bank arranged proximate to a peripheral circuit block from among a plurality of banks and memory cells connected to a second word line of a second bank arranged distant from the peripheral circuit block from among the plurality of banks and may be written thereto (e.g., in a manner as described herein).

In the bit line interleaving operation (S2030), information data may be mixed in memory cells connected to a first bit line of the first memory area and memory cells connected to a second bit line of the second memory area and may be written thereto (e.g., in a manner as described herein).

In the convolution interleaving operation (S2040), information data may be mixed in memory cells connected to a first word line and first bit lines of the first memory area and memory cells connected to a second word line and second bit lines of the second memory area and may be written thereto (e.g., in a manner as described herein).

In the stack layer interleaving operation (S2050), information data may be mixed in memory cells connected to a first word line and first bit lines of a lower memory tile from among stacked memory tiles and memory cells connected to a second word line and second bit lines of an upper memory time from among the stacked memory tiles and may be written thereto (e.g., in a manner as described herein).

In the chip interleaving operation (S2060), information data may be mixed in memory cells connected to a first word line of a first memory chip from among a plurality of memory chips and memory cells connected to a second word line of a second memory chip from among the plurality of memory chips and may be written thereto (e.g., in a manner as described herein).

Figure 21:
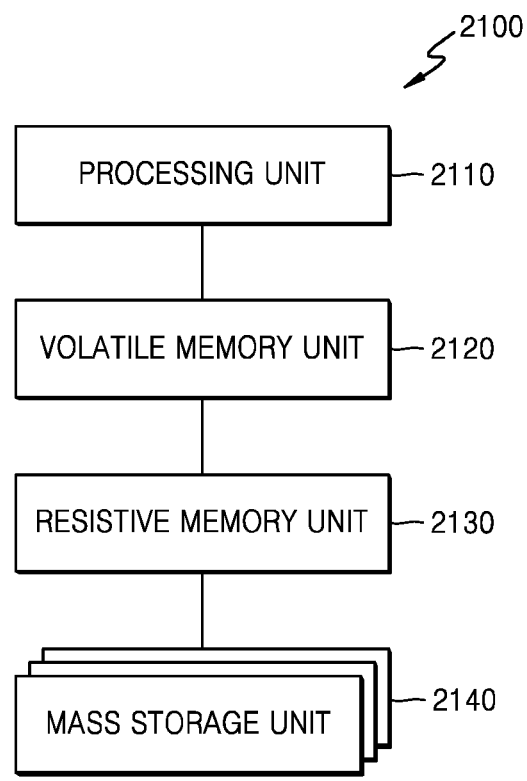
FIG. 21 is a block diagram of a system including a memory device, according to an embodiment of the inventive concept.

FIG. 21 is a block diagram of a system 2100 according to an embodiment of the inventive concept.

Referring to FIG. 21, the system 2100 may include a processing unit 2110, a volatile memory unit 2120, a resistive memory unit 2130, and a mass storage unit 2140. The resistive memory unit 2130 may comprise one or more of the memory devices 100 and/or memory module 1900 as described herein. The system 2100 may be a general- or special-use computer system such as a mobile device, a personal computer, a server computer, a programmable home appliance, or a mainframe computer.

The processing unit 2110 may execute an operating system and a plurality of software systems and perform certain calculations or tasks. The processing unit 2110 may be a microprocessor, a central processing unit (CPU) and/or a graphical processing unit (GPU).

The volatile memory unit 2120 serves as operating memory or cache memory of the system 2100 and refers to a medium for storing data for a short term or in a temporary manner. The volatile memory unit 2120 may include at least one memory device (e.g., DRAM, SRAM).

The resistive memory unit 2130 may be used as cache memory of the mass storage unit 2140. The resistive memory unit 2130 may store frequently accessed applications or a part of data of the operating system. The resistive memory unit 2130 may include at least one memory device (e.g., PRAM). Since data access to the resistive memory unit 2130 is much faster than that to the mass storage unit 2140 such as a hard disk drive (HDD), the resistive memory unit 2130 may be useful as cache memory. The resistive memory unit 2130 may be implemented as one or more of the embodiments described above in relation to FIGS. 1 through 20.

When the resistive memory unit 2130 writes a codeword including information data and parity bit(s) of the information data to a memory cell array, the resistive memory unit 2130 may divide an ECC sector including the information data into a first ECC sub-sector and a second ECC sub-sector and may perform an ECC interleaving operation such that the first ECC sub-sector is written to a first memory area having a high BER and the second ECC sub-sector is written to a second memory area having a low BER. Accordingly, respective BERs of pieces of information data written to the first memory area and the second memory area may be equalized.

The mass storage unit 2140 may be implemented as an HDD, a solid state drive (SDD), a peripheral component interconnect express (PCIe) memory module, non-volatile memory express (NVMe), or the like. Optionally, one or more tiers of the mass storage unit 2140 may be implemented as one or more network-accessible devices and/or services, e.g., NVMe-over Fabrics (NVMe-oF)- and/or Remote Direct Memory Access (RDMA)-connected clients, servers, server farm(s), server cluster(s), application server(s), or message server(s). The mass storage unit 2140 refers to a storage medium used when the system 2100 stores user data for a long term. The mass storage unit 2140 may store application programs, program data, etc.

While the inventive concept has been particularly shown and described with reference to embodiments thereof, it will be understood that various changes in form and details may be made therein without departing from the spirit and scope of the following claims.

What is claimed is:

1. A resistive type memory device comprising:
    a plurality of banks, each bank comprising a bank row decoder connected to a plurality of word lines of the bank, a bank column decoder connected to a plurality of bit lines of the bank, and a memory cell bank array having memory cells arranged in a plurality of rows and columns, each row of memory cells connected to a corresponding one of the word lines and each column of memory cells being connected to a corresponding one of the bit lines, the memory cells of each bank being organized in a plurality of tiles, each of the memory cells comprising a variable resistor that is programmable to store at least one bit of data;
    an address register configured to provide a sequence of memory addresses, each memory address including a bank address identifying one of the plurality of banks, a row address identifying a word line location within the bank identified by the bank address and a column address identifying a subset of bit lines connected to the word line identified by the row address; and
    a control circuit configured to provide each row address and column address of each memory address stored by the address register respectively to the bank row decoder and column decoder of the bank identified by the bank address of the corresponding memory address,
    wherein, for at least each memory address of a subset of the memory addresses, the control circuit is configured to modify at least one of the corresponding row address and the corresponding column address such that at least one of the following is true:
        a relative location of a first word line identified by a first row address within a first bank of the plurality of banks is different from a relative location of a second word line identified by the first row address within a second bank of the plurality of banks, and
        relative locations of first bit lines identified by a first column address within a first bank of the plurality of banks is different from corresponding relative locations of second bit lines identified by the first column address within a second bank of the plurality of banks,
    wherein, for the subset of the memory addresses, the control circuit is configured to modify the corresponding row address so that the relative location of the first word line identified by the first row address within the first bank of the plurality of banks is different from the relative location of the second word line identified by the first row address within the second bank of the plurality of banks,
    wherein the first word line is located in a first area of the first bank and the second word line is located in a second area of the second bank, and
    wherein the first area comprises memory cells having a higher resistance distribution degradation than memory cells of the second area.

2. The resistive type memory device of claim 1, wherein the first area is located at an edge of the first bank and the second area is located at a center of the second bank.

3. The resistive type memory device of claim 1, wherein the first area is located at an edge of a horizontal block of memory tiles of the first bank through which the first word line extends and the second area is centrally located in a horizontal block of memory tiles of the second bank through which the second word line extends.

4. The resistive type memory device of claim 1, wherein the control circuit comprises an address modification circuit configured to invert at least one of the more significant bits of all of the row addresses of the subset of the memory addresses.

5. The resistive type memory device of claim 4, wherein the subset of memory addresses is half of all of the memory addresses of the resistive type memory device.

6. The resistive type memory device of claim 4, wherein the subset of memory addresses are all of the addresses of half of the banks of the resistive type memory device.

7. The resistive type memory device of claim 4,
    wherein the address modification circuit is configured to invert the most significant bit of all of the row addresses of the subset of the memory addresses,
    wherein the most significant bit of row addresses of memory addresses that are not part of the subset of the memory addresses are not subject to inversion.

8. The resistive type memory device of claim 4,
wherein, for all of the row addresses of the subset of the memory addresses, the address modification circuit is configured to invert the most significant bit and an nth most significant but not an mth most significant bit, where the mth most significant bit is more significant than the nth most significant bit, and
wherein, for row addresses of memory addresses that are not part of the subset of the memory addresses, at least one of the most significant bit and the nth most significant bit are not subject to inversion.

9. The resistive type memory device of claim 4, wherein bits of row addresses of memory addresses that are not part of the subset of the memory addresses are not subject to inversion.

10. The resistive type memory device of claim 1,
wherein the address register comprises a row address counter configured to provide row addresses in numerical order to the control circuit,
wherein, for the subset of the memory addresses, the control circuit is configured to modify the corresponding row address provided by the row address counter.

11. The resistive type memory device of claim 1,
wherein the plurality of tiles are arranged in a stack of layers including a first stack layer and a second stack layer, each layer of the stack including some of the plurality of tiles arranged in a two dimensional array,
wherein first word line is located in the first area of the first bank in the first stack layer and the second word line is located in the second area of the second bank in the second stack layer.

12. The resistive type memory device of claim 11, where the memory device is formed as a semiconductor chip.

13. The resistive type memory device of claim 1, wherein the memory device is configured to store a plurality of codewords, each codeword including a corresponding error correction code and having portions respectively stored in memory rows of different ones of the banks that are identified by the same row address and are located at different relative locations within the corresponding bank.

14. A resistive type memory device comprising:
a plurality of banks, each bank comprising a bank row decoder connected to a plurality of word lines of the bank, a bank column decoder connected to a plurality of bit lines of the bank, and a memory cell bank array having memory cells arranged in a plurality of rows and columns, each row of memory cells connected to a corresponding one of the word lines and each column of memory cells being connected to a corresponding one of the bit lines, the memory cells of each bank being organized in a plurality of tiles, each of the memory cells comprising a variable resistor that is programmable to store at least one bit of data;
an address register configured to provide a sequence of memory addresses, each memory address including a bank address identifying one of the plurality of banks, a row address identifying a word line location within the bank identified by the bank address and a column address identifying a subset of bit lines connected to the word line identified by the row address; and
a control circuit configured to provide each row address and column address of each memory address stored by the address register respectively to the bank row decoder and column decoder of the bank identified by the bank address of the corresponding memory address,
wherein, for at least each memory address of a subset of the memory addresses, the control circuit is configured to modify at least one of the corresponding row address and the corresponding column address such that at least one of the following is true:
a relative location of a first word line identified by a first row address within a first bank of the plurality of banks is different from a relative location of a second word line identified by the first row address within a second bank of the plurality of banks, and
relative locations of first bit lines identified by a first column address within a first bank of the plurality of banks is different from corresponding relative locations of second bit lines identified by the first column address within a second bank of the plurality of banks,
wherein, for the subset of the memory addresses, the control circuit is configured to modify the corresponding row address so that the relative location of the first word line identified by the first row address within the first bank of the plurality of banks is different from the relative location of the second word line identified by the first row address within the second bank of the plurality of banks,
wherein, with respect to the first bank, a sequence of row addresses in numerical order from the lowest row address of the sequence to the highest row address of the sequence sequentially identifies word lines from a first edge of the first bank to a second edge of the first bank, and
wherein, with respect to the second bank, the sequence of row addresses in numerical order from the lowest row address of the range to the highest row address of the range sequentially identifies word lines in locational order from a center of the second bank to a first edge of the second bank and then from a second edge of the first bank to a center of the second bank.

15. A resistive type memory device comprising:
a plurality of banks, each bank comprising a bank row decoder connected to a plurality of word lines of the bank, a bank column decoder connected to a plurality of bit lines of the bank, and a memory cell bank array having memory cells arranged in a plurality of rows and columns, each row of memory cells connected to a corresponding one of the word lines and each column of memory cells being connected to a corresponding one of the bit lines, the memory cells of each bank being organized in a plurality of tiles, each of the memory cells comprising a variable resistor that is programmable to store at least one bit of data;
an address register configured to provide a sequence of memory addresses, each memory address including a bank address identifying one of the plurality of banks, a row address identifying a word line location within the bank identified by the bank address and a column address identifying a subset of bit lines connected to the word line identified by the row address; and
a control circuit configured to provide each row address and column address of each memory address stored by the address register respectively to the bank row decoder and column decoder of the bank identified by the bank address of the corresponding memory address,
wherein, for at least each memory address of a subset of the memory addresses, the control circuit is configured to modify at least one of the corresponding row address and the corresponding column address such that at least one of the following is true:
a relative location of a first word line identified by a first row address within a first bank of the plurality of banks is different from a relative location of a second word line identified by the first row address within a second bank of the plurality of banks, and relative locations of first bit lines identified by a first column address within a first bank of the plurality of banks is different from corresponding relative locations of second bit lines identified by the first column address within a second bank of the plurality of banks wherein, for the subset of the memory addresses, the control circuit is configured to modify the corresponding row address so that the relative location of the first word line identified by the first row address within the first bank of the plurality of banks is different from the relative location of the second word line identified by the first row address within the second bank of the plurality of banks, wherein, with respect to the first bank, a sequence of row addresses in numerical order of a range of row addresses from the lowest row address of the range to the highest row address of the range sequentially identifies word lines in locational order arranged from a first edge of a first tile of the first bank to a second edge of the first tile of the first bank, and wherein, with respect to the second bank, the sequence of row addresses in numerical order of the range from the lowest row address of the range to the highest row address of the range sequentially identifies word lines in locational order from a center of a first tile of the second bank to a first edge of the first tile of the second bank and then from a second edge of the first tile of the second bank to a center of the first tile of the second bank.

16. A resistive type memory device comprising:

a plurality of banks, each bank comprising a bank row decoder connected to a plurality of word lines of the bank, a bank column decoder connected to a plurality of bit lines of the bank, and a memory cell bank array having memory cells arranged in a plurality of rows and columns, each row of memory cells connected to a corresponding one of the word lines and each column of memory cells being connected to a corresponding one of the bit lines, the memory cells of each bank being organized in a plurality of tiles, each of the memory cells comprising a variable resistor that is programmable to store at least one bit of data;

an address register configured to provide sequence of memory addresses, each memory address including a bank address identifying one of the plurality of banks, a row address identifying a word line location within the bank identified by the bank address and a column address identifying a subset of bit lines connected to the word line identified by the row address; and a control circuit configured to provide each row address and column address of each memory address stored by the address register respectively to the bank row decoder and column decoder of the bank identified by the bank address of the corresponding memory address, wherein, for at least each memory address of a subset of the memory addresses, the control circuit is configured to modify at least one of the corresponding row address and the corresponding column address such that at least one of the following is true:

wherein a relative location of a first word line identified by a first row address within a first bank of the plurality of banks is different from a relative location of a second word line identified by the first row address within a second bank of the plurality of banks, wherein relative locations of first bit lines identified by a first column address within a first bank of the plurality of banks is different from corresponding relative locations of second bit lines identified by the first column address within a second bank of the plurality of banks, and wherein, for the subset of the memory addresses, the control circuit is configured to modify the corresponding column address so that relative locations of the first bit lines identified by the first column address within the first bank of the plurality of banks are different from corresponding relative locations of second bit lines identified by the first column address within the second bank of the plurality of banks, and wherein memory cells connected to the first bit lines have a higher resistance distribution degradation than memory cells connected to the second bit lines.

17. The resistive type memory device of claim 16, wherein the first bit lines are located at an edge of the first bank and the second bit lines are located at a center of the second bank.

18. The resistive type memory device of claim 16, wherein the tiles of each bank are arranged in columns to form corresponding bays of tiles, wherein the first bit lines are arranged at corresponding edges of corresponding bays of the first bank and the second bit lines are arranged at central locations of corresponding bays of the second bank.

* * * * *